(12) United States Patent
Yoon et al.

(10) Patent No.: US 11,058,018 B1
(45) Date of Patent: Jul. 6, 2021

(54) ELECTRONIC DEVICE INCLUDING FLEXIBLE DISPLAY

(71) Applicant: Samsung Electronics Co., Ltd., Suwon-si (KR)

(72) Inventors: Yeonggyu Yoon, Suwon-si (KR); Youngmin Kang, Suwon-si (KR); Moonchul Shin, Suwon-si (KR); Seungjoon Lee, Suwon-si (KR); Joongyeon Cho, Suwon-si (KR); Byounguk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/201,532

(22) Filed: Mar. 15, 2021

(30) Foreign Application Priority Data

Oct. 12, 2020 (KR) .................. 10-2020-0131465

(51) Int. Cl.
*H05K 5/02* (2006.01)
*H05K 5/00* (2006.01)
(Continued)

(52) U.S. Cl.
CPC ......... *H05K 5/0217* (2013.01); *G06F 1/1624* (2013.01); *G06F 1/1652* (2013.01);
(Continued)

(58) Field of Classification Search
None
See application file for complete search history.

(56) References Cited

U.S. PATENT DOCUMENTS 7,480,524 B2 * 1/2009 Moon ................. H04M 1/0237
455/575.4
10,410,549 B1 * 9/2019 Kim ...................... G06F 1/1601
(Continued)

FOREIGN PATENT DOCUMENTS

KR 10-2010-0028343 A 3/2010
KR 10-2012-0101508 A 9/2012
(Continued)

OTHER PUBLICATIONS

Korean Preliminary examination result report dated Feb. 8, 2021, issued in Korean Application No. 10-2020-0131465.

*Primary Examiner* — Xanthia C Cunningham
(74) *Attorney, Agent, or Firm* — Jefferson IP Law, LLP

(57) ABSTRACT

An electronic device is provided. The electronic device includes a housing, a plate capable of being slid out from the housing, a flexible display including a first area disposed on one surface of the plate, and a second area extending from the first area and at least partially drawn out from an inner space of the housing when the plate is slid out, a curved member positioned in an inner space of the housing to correspond to the second area, a first linear gear positioned on another surface of the plate, and including a plurality of gear teeth arranged in a first direction in which the plate is slid out, a second linear gear including a plurality of gear teeth arranged in the first direction, and a circular gear capable of being rotated about a rotation shaft perpendicular to the first direction, and disposed between the first linear gear and the second linear gear to be spaced apart from the curved member in a second direction opposite to the first direction, the circular gear being engaged with the first linear gear and the second linear gear.

22 Claims, 20 Drawing Sheets

(51) Int. Cl.
*G06F 1/16* (2006.01)
*H04N 5/225* (2006.01)
*G06F 3/041* (2006.01)

(52) U.S. Cl.
CPC ......... *H05K 5/0017* (2013.01); *G06F 3/0412* (2013.01); *G06F 2203/04102* (2013.01); *G06F 2203/04105* (2013.01); *H04N 5/2257* (2013.01)

(56) References Cited

U.S. PATENT DOCUMENTS

| | | | | |
|---|---|---|---|---|
| 2011/0151935 | A1 | 6/2011 | Oksman et al. | |
| 2013/0058063 | A1* | 3/2013 | O'Brien | G06F 1/1652 361/807 |
| 2014/0194165 | A1* | 7/2014 | Hwang | G06F 1/1652 455/566 |
| 2015/0229844 | A1* | 8/2015 | Yamazaki | G06F 1/1652 348/333.01 |
| 2016/0143131 | A1* | 5/2016 | Ahn | H04M 1/0237 361/749 |
| 2018/0103551 | A1* | 4/2018 | Park | G06F 1/1652 |
| 2018/0129246 | A1* | 5/2018 | Ko | G06F 1/1616 |
| 2019/0317550 | A1 | 10/2019 | Kim et al. | |
| 2020/0209924 | A1* | 7/2020 | Zuo | G06F 3/1423 |
| 2021/0041909 | A1 | 2/2021 | Ahn | |

FOREIGN PATENT DOCUMENTS

| | | |
|---|---|---|
| KR | 10-2017-0008610 A | 1/2017 |
| KR | 10-2019-0077107 A | 7/2019 |
| KR | 10-2019-0109980 A | 9/2019 |
| KR | 10-2019-0115888 A | 10/2019 |
| KR | 10-2019-0119719 A | 10/2019 |
| WO | 2013/033479 A2 | 3/2013 |

\* cited by examiner

ELECTRONIC DEVICE INCLUDING FLEXIBLE DISPLAY

CROSS-REFERENCE TO RELATED APPLICATION(S)

This application is based on and claims priority under 35 U.S.C. § 119(a) of a Korean patent application number 10-2020-0131465, filed on Oct. 12, 2020, in the Korean Intellectual Property Office, the disclosure of which is incorporated by reference herein in its entirety.

BACKGROUND

1. Field

The disclosure relates to an electronic device including a flexible display. More particularly, the disclosure relates to an electronic device including a flexible display, in which a screen can be expanded in a sliding manner and screen lift can be prevented while a smooth and gentle sliding operation can be ensured in the electronic device.

2. Description of Related Art

With the development of digital technologies, electronic devices are being provided in various forms, such as a smart phone, a tablet personal computer (PC), and a personal digital assistant (PDA). Electronic devices are being designed to provide a larger screen while having a portable size that does not cause inconvenience to a user's hand.

The above information is presented as background information only to assist with an understanding of the disclosure. No determination has been made, and no assertion is made, as to whether any of the above might be applicable as prior art with regard to the disclosure.

SUMMARY

An electronic device may be implemented to expand a screen, for example, in a sliding manner A portion of a flexible display is drawn out from the inner space of the electronic device in a sliding manner, and thus the screen can be expanded. Such an electronic device is required to have a sliding structure to support a smooth sliding operation and to prevent screen lift caused by elasticity of the flexible display.

Aspects of the disclosure are to address at least the above-mentioned problems and/or disadvantages and to provide at least the advantages described below. Accordingly, an aspect of the disclosure is to provide an electronic device including a flexible display, in which a screen can be expanded in a sliding manner and screen lift can be prevented while a smooth and gentle sliding operation can be ensured in the electronic device.

The technical problems to be addressed by this disclosure are not limited to those described above, and other technical problems, which are not described above, may be clearly understood by a person ordinarily skilled in the related art to which this disclosure belongs.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a plate capable of being slid out from the housing, a flexible display including a first area disposed on one surface of the plate, and a second area extending from the first area and at least partially drawn out from an inner space of the housing when the plate is slid out, a curved member positioned in an inner space of the housing to correspond to the second area, a first linear gear positioned on another surface of the plate, and including a plurality of gear teeth arranged in a first direction in which the plate is slid out, a second linear gear including a plurality of gear teeth arranged in the first direction, and a circular gear capable of being rotated about a rotation shaft perpendicular to the first direction, and disposed between the first linear gear and the second linear gear to be spaced apart from the curved member in a second direction opposite to the first direction, the circular gear being engaged with the first linear gear and the second linear gear.

An electronic device including a flexible display according to various embodiments is capable of preventing screen lifting while enabling a smooth and gentle sliding operation. Therefore, reliability of an electronic device can be improved in which a screen is capable of being expanded in a sliding manner. In addition, space utilization can be improved due to a simplified sliding structure.

In addition, effects obtained or predicted by various embodiments will be directly or implicitly disclosed in the detailed description of the embodiments. For example, various effects predicted according to various embodiments will be disclosed in the following detailed description.

Before undertaking the DETAILED DESCRIPTION below, it may be advantageous to set forth definitions of certain words and phrases used throughout this patent document, the terms "include" and "comprise," as well as derivatives thereof, mean inclusion without limitation, the term "or," is inclusive, meaning and/or, the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like, and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

FIGS. 1 to 15, discussed below, and the various embodiments used to describe the principles of the disclosure in this patent document are by way of illustration only and should not be construed in any way to limit the scope of the disclosure. Those skilled in the art will understand that the principles of the disclosure may be implemented in any suitably arranged system or device.

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions are omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
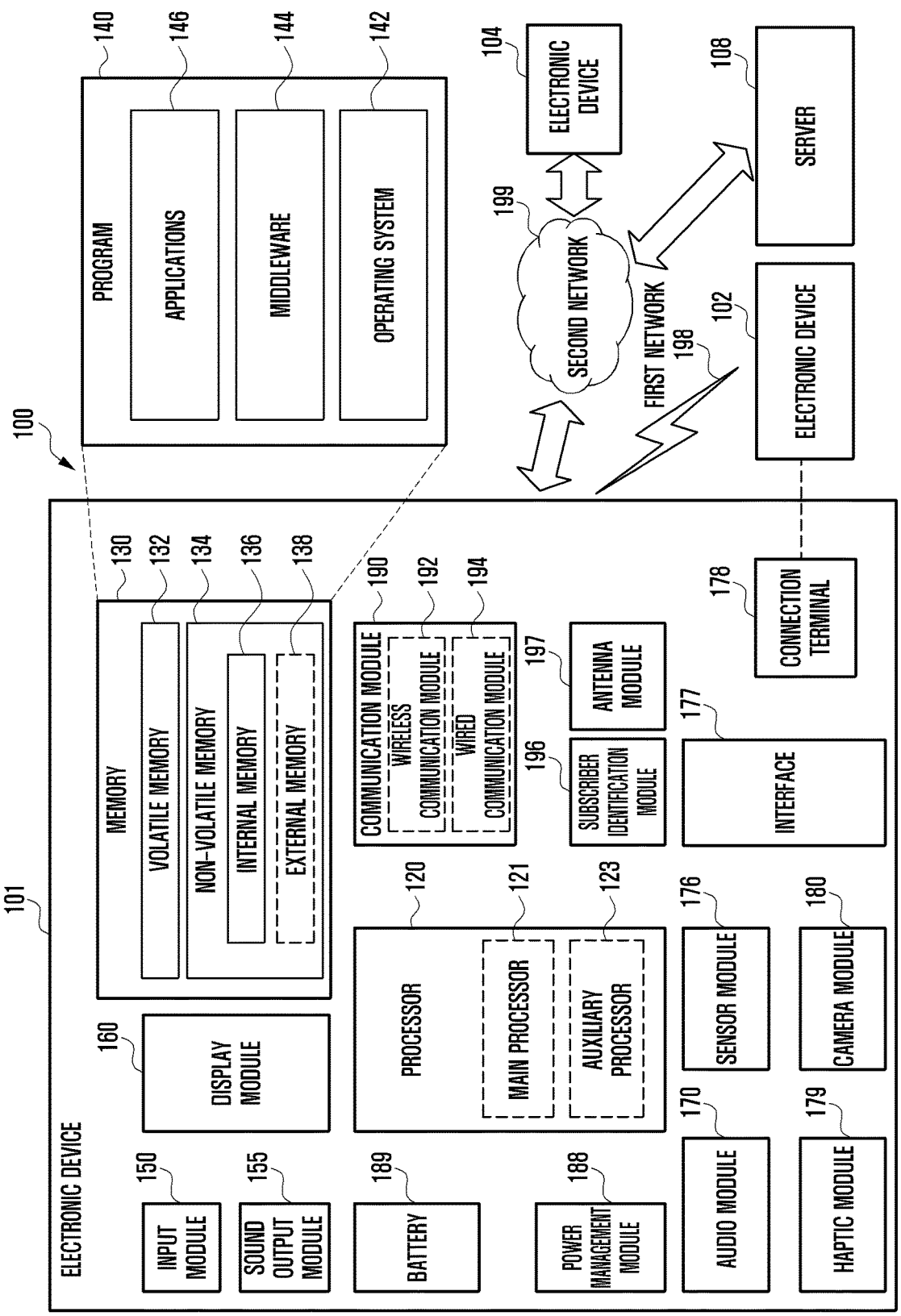
FIG. 1 is a block diagram of an electronic device according to an embodiment of the disclosure.

FIG. 1 is a block diagram of an electronic device 101 in a network environment 100 according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input module 150, an audio output module 155, a display module 160, an audio module 170, a sensor module 176, an interface 177, a connection terminal 178, a haptic module 179, a camera module 180, a power management module 188, a battery 189, a communication module 190, a subscriber identity module (SIM) 196, or an antenna module 197. In some embodiments of the disclosure, at least one (e.g., the connection terminal 178) of the components may be omitted from the electronic device 101, or one or more other components may be added in the electronic device 101. In some embodiments of the disclosure, some of the components may be implemented as single integrated circuitry. For example, the sensor module 176 (e.g., the sensor module 176, the camera module 180, or the antenna module 197) may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, an auxiliary processor 123 (e.g., a neural network processing device) may include a hardware structure specialized for processing an artificial intelligence model. The artificial intelligence model may be created through machine learning. Such learning may be performed, for example, in the electronic device 101 itself on which artificial intelligence is executed, or may be performed through a separate server (e.g., the server 108). The learning algorithm may include, for example, supervised learning, unsupervised learning, semi-supervised learning, or reinforcement learning, but is not limited thereto. The artificial intelligence model may include a plurality of artificial neural network layers. An artificial neural network may be any of a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-networks, or a combination of two or more of the above-mentioned networks, but is not limited to the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or external memory 138.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The audio output module 155 may output sound signals to the outside of the electronic device 101. The audio output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the audio output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

The connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture an image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or a standard of the Infrared Data Association (IrDA)) or the second network 199 (e.g., a long-range communication network, such as a legacy cellular network, 5th generation network, a next generation network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network and a next-generation communication technology, such as a new radio access technology. An NR access technology may support high-speed transmission of high-capacity data (i.e., an enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) in order to achieve, for example, a high data transmission rate. The wireless communication module 192 may support various technologies for securing performance in a high-frequency band, such as beamforming, massive multiple-input and multiple-output (MIMO), and full-dimensional multiple-input and multiple-output (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an embodiment of the disclosure, the wireless communication module 192 may support a peak data rate for realizing eMBB (e.g., 20 Gbps or more), loss coverage for realizing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a PCB). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, an RFIC that is disposed on or adjacent to a first surface (e.g., the bottom surface) of the printed circuit board and is capable of supporting a predetermined high-frequency band (e.g., a mmWave band), and a plurality of antennas (e.g., array antennas) that is disposed on or adjacent to a second surface (e.g., the top surface or the side surface) of the printed circuit board and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, a mobile edge computing (MEC), or client-server computing technology may be used, for example. The electronic device 101 may provide an ultra-low delay service using, for example, distributed computing or mobile edge computing. In another embodiment of the disclosure, the external electronic device 104 may include an Internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on a 5G communication technology and an IoT-related technology.

An electronic device according to an embodiment of the disclosure may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment.

With regard to the description of the drawings, similar reference numerals may be used to refer to similar or related elements.

As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases.

As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAY-STORE), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2A:
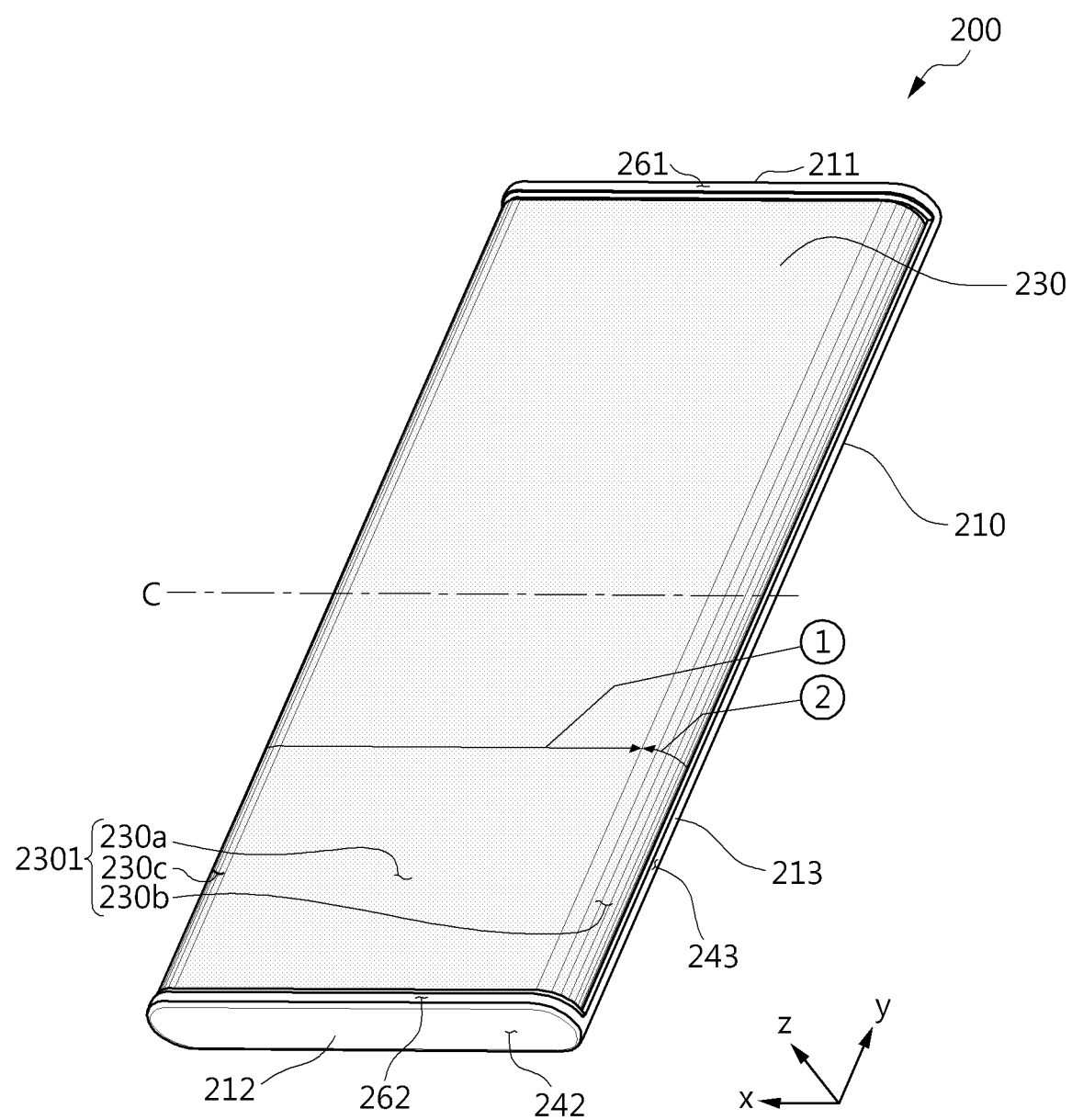
FIG. 2A is a front perspective view illustrating an electronic device in a closed state according to an embodiment of the disclosure.
Figure 2B:
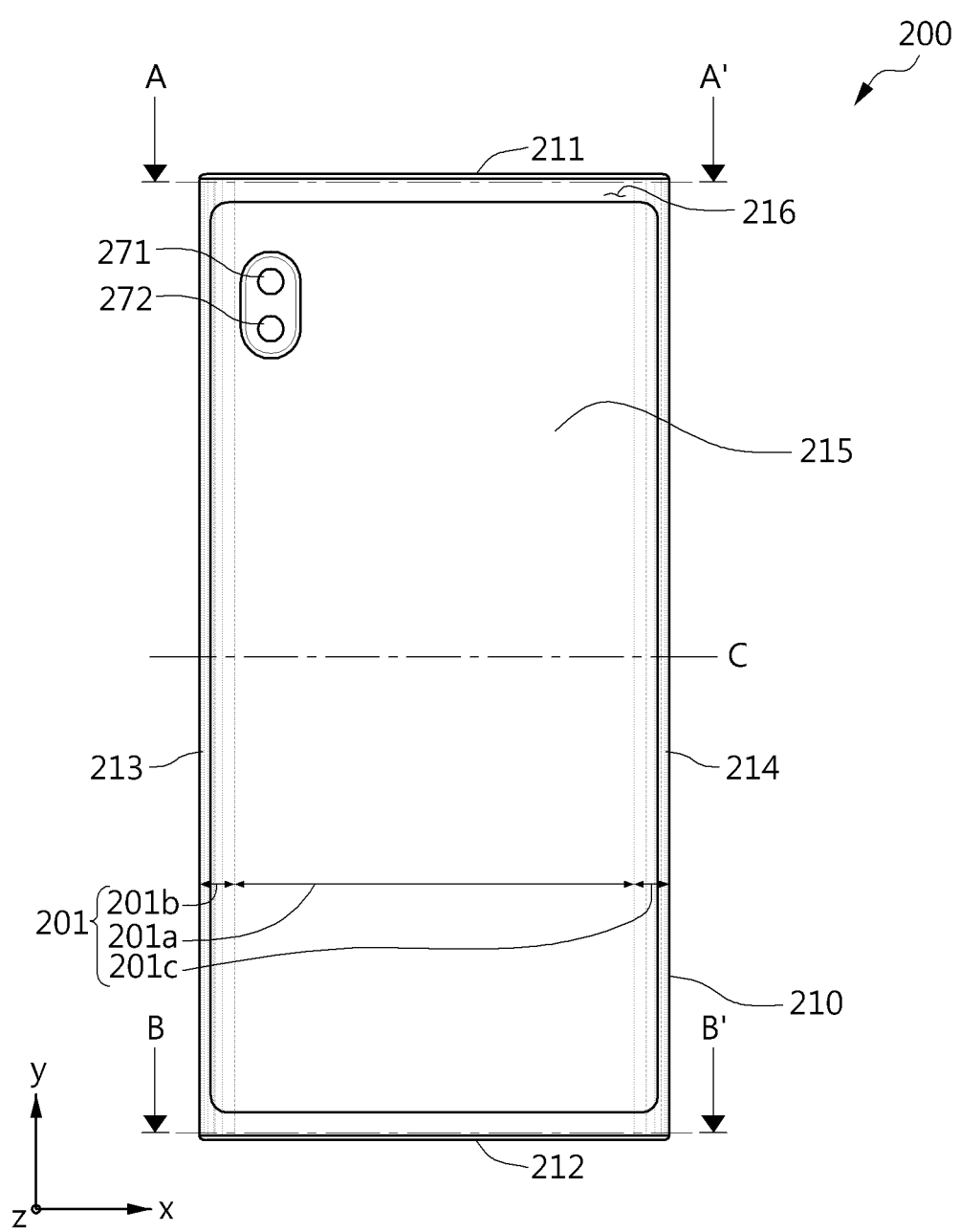
FIG. 2B is a rear perspective view illustrating an electronic device in a closed state according to an embodiment of the disclosure.
Figure 3A:
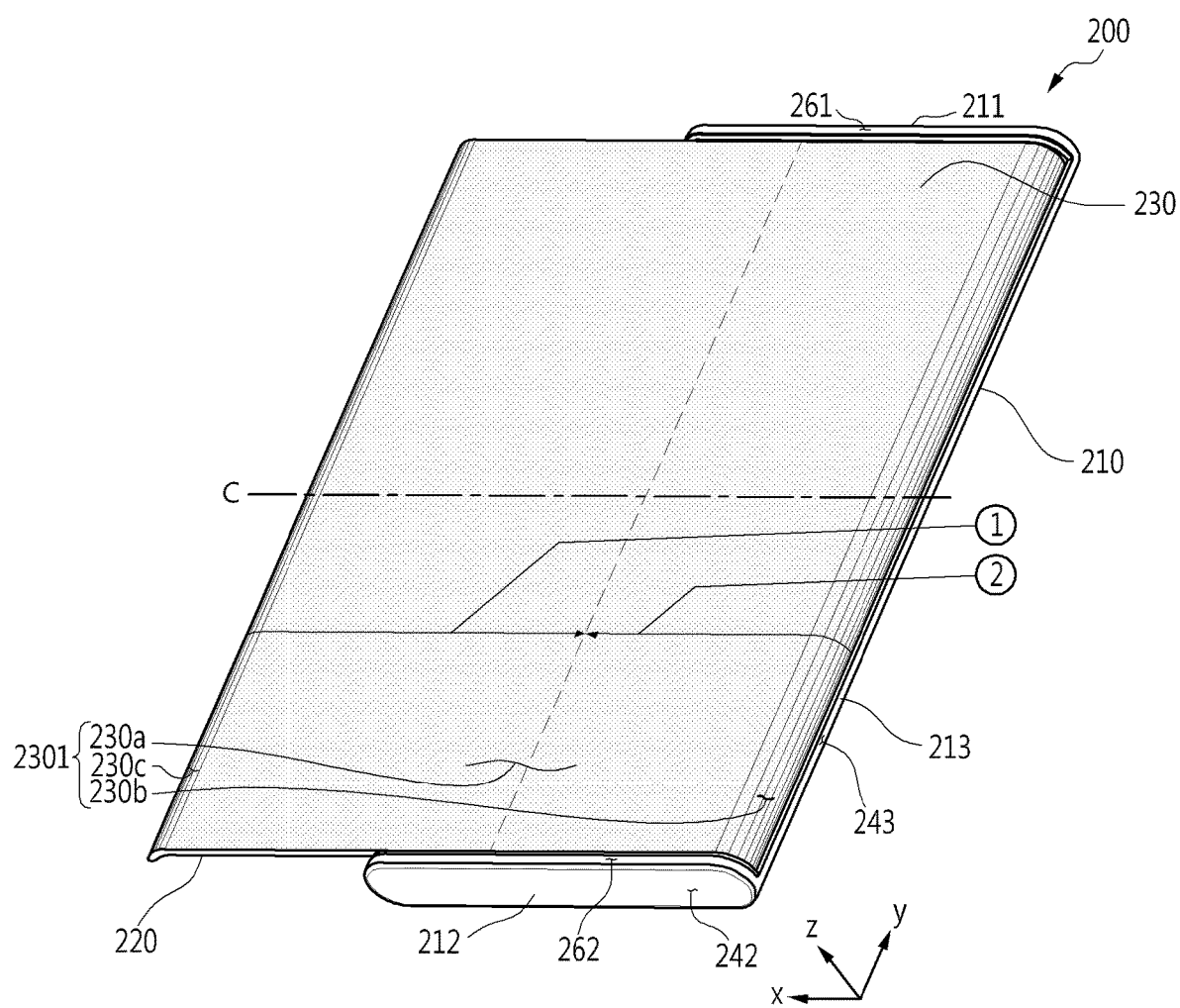
FIG. 3A is a front perspective view illustrating an electronic device in an open state according to an embodiment of the disclosure.
Figure 3B:
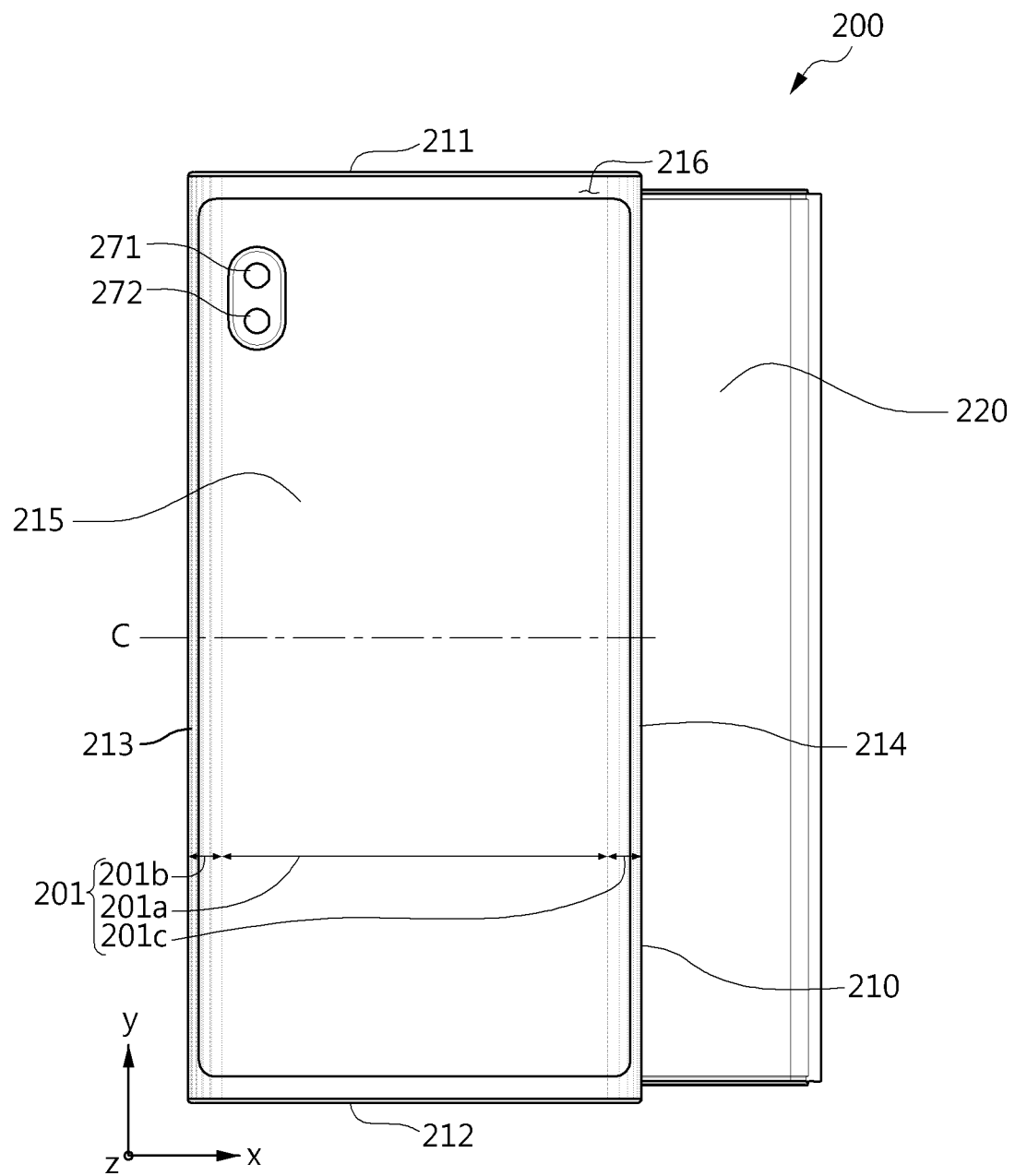
FIG. 3B is a rear perspective view illustrating an electronic device in an open state according to an embodiment of the disclosure.

FIG. 2A is a front perspective view illustrating an electronic device 200 in a closed state according to an embodiment of the disclosure. FIG. 2B is a rear perspective view illustrating an electronic device 200 in a closed state according to an embodiment of the disclosure. FIG. 3A is a front perspective view illustrating an electronic device 200 in an open state according to an embodiment of the disclosure. FIG. 3B is a rear perspective view illustrating an electronic device in an open state 200 according to an embodiment of the disclosure.

Referring to FIGS. 2A, 2B, 3A, and 3B, the electronic device 200 may include a housing 210, a sliding plate 220, and a flexible display 230.

The housing (or housing structure) 210 may include, for example, a first side housing part 211, a second side housing part 212, and a third side housing part 213, a fourth side housing part 214, and a rear housing part (hereinafter, referred to as a back cover) 215. The first side housing part 211 and the second side housing part 212 may be positioned opposite to each other to correspond to both short edges of the back cover 215. The third side housing part 213 and the fourth side housing part 214 and may be positioned opposite to each other to correspond to both long edges of the back cover 215. The first side housing part 211, the second side housing part 212, the third side housing part 213, and the fourth side housing part 214 may include a metal and/or a polymer, and may be integrally formed. The back cover 215 may be substantially opaque. The back cover 215 may be formed of, for example, coated or colored glass, ceramic, a polymer, a metal (e.g., aluminum, stainless steel (STS), or magnesium), or a combination of at least two of these materials.

According to an embodiment of the disclosure, the electronic device 200 may be implemented to be capable of expanding a screen 2301 in a sliding manner. For example, the screen 2301 may be a display area (or an active area) that is visible to the outside of the flexible display 230. FIGS. 2A and 2B illustrate the electronic device 200 in the state in which the screen 2301 is not expanded, and FIGS. 3A and 3B illustrate the electronic device 200 in the state in which the screen 2301 is expanded. The state in which the screen 2301 is not expanded is the state in which the sliding plate 220 is not moved in a first direction (e.g., the +x axis direction) with respect to the housing 210, and may be referred to as the closed state of the electronic device 200. The state in which the screen 2301 is expanded is the state in which the sliding plate 220 is moved to the maximum and does not move in the first direction any more with respect to the housing 210, and may be referred to as the open state of the electronic device 200. In some embodiments of the disclosure, the open state may include a fully open state (see FIG. 3A) or an intermediate state. The intermediate state may refer to a state between the closed state (see FIG. 2A) and the fully open state. In some embodiments of the disclosure, when the sliding plate 220 is at least partially moved in the first direction with respect to the housing 210, it may be referred to as "slide-out" of the sliding plate 220. In some embodiments of the disclosure, when the sliding plate 220 is at least partially moved in a second direction opposite to the first direction (e.g., the −x axis direction) with respect to the housing 210, it may be referred to as "slide-in" of the sliding plate 220. The first direction may be referred to as a "slide-out direction", and the second direction may be referred to as a "slide-in direction".

According to an embodiment of the disclosure, the flexible display 230 may include a first area ① and a second area ②. The first area ① may be disposed to overlap the sliding plate 220. The second area ② may include an extended portion of the screen 2301 when the electronic device 200 is switched from the closed state (see FIG. 2A) to the open state (see FIG. 3A). When the electronic device 200 is switched from the closed state to the open state, at least a portion of the second area ② is drown out from the inner space of the electronic device 200 in a sliding manner, and thus the screen 2301 can be expanded. When the electronic device 200 is switched from the open state to the closed state, at least a portion of the second area ② is introduced into the inner space of the electronic device 200 in a sliding manner, and thus the screen 2301 can be contracted. The second area (②) is a portion of the flexible display 230 that is bent when the electronic device 200 is switched between the open state and the closed state, and may be referred to as, for example, a "bendable area" or a "bendable section". The screen 2301 may include an active area (or a display area) of the flexible display 230 that is visually exposed to output an image, and the electronic device 200 may adjust the active area depending on the movement of the sliding plate 220 or the movement of the flexible display 230. In the following description, the open state may refer to the state in which the screen 2301 is expanded to the maximum. In some embodiments of the disclosure, in the electronic device 200 having an expandable screen 2301 corresponding to the slide-out of the sliding plate 220, the flexible display 230 may be referred to as another term, such as an "expandable display" or a "slide-out display". According to various embodiments of the disclosure, the electronic device 200 including the flexible display 230 may include the electronic device 101 of FIG. 1.

According to an embodiment of the disclosure, the screen 2301 may include a first flat part 230a, and may further include a first curved part 230b and a second curved part 230c positioned opposite to each other, with the first flat part 230a interposed therebetween. For example, the first curved part 230b and the second curved part 230c may be substantially symmetrical, with the first flat part 230a interposed therebetween. The first flat part 230a may be expanded or contracted according to a state change (e.g., switching between the closed state and the open state) of the electronic device 200. The first curved part 230b may be provided in substantially the same shape even when the state of the electronic device 200 is changed. A portion of the second area ② of the flexible display 230 that forms the first curved part 230b may vary depending on the state change of the electronic device 200. For example, a portion of the second area ② forming the first curved part 230b in the closed state of FIG. 2A is included in the first flat part 230a expanded when the electronic device is switched from the closed state of FIG. 2A to the open state of FIG. 3A, and the first curved part 230 may be formed as another portion of the second area ② the area is switched from the open state of FIG. 3A. The first curved part 230b may be positioned opposite to the second curved part 230c in the closed or the open state of the electronic device 200 so as to improve the aesthetics of the screen 2301. According to some embodiments of the disclosure, the first flat part 230a may be implemented in an expanded form without the second curved part 230c.

Referring to the closed state of the electronic device 200 illustrated in FIG. 2A, the electronic device 200 may include the rear surface 201 of the electronic device 200 positioned opposite to the screen 2301. The rear surface 201 may include a second flat part 201a, and may further include a third curved part 201b and a fourth curved part 201c positioned opposite to each other, with the second flat part 201a interposed therebetween. The second flat part 201a is positioned to correspond to the first flat part 230a of the screen 2301, and may be parallel to the first flat part 230a. The third curved part 201b is positioned to correspond to the first curved part 230b of the screen 2301, and may include a curved surface curved from the second flat part 201a toward the first curved part 230b. The fourth curved part 210c is positioned to correspond to the second curved part 230c of the screen 2301, and may include a curved surface curved from the second flat part 201a toward the second curved part 230c. Referring to the closed state of the electronic device 200, the first side housing part 211, the second side housing part 212, the third side housing part 213, and the fourth side housing part 214 may form a bezel structure surrounding the space between the screen 2301 and the back cover 215. The rear surface 201 of the electronic device 200 may be formed by the back cover 215 and a portion 216 of the bezel structure surrounding the back cover 215. The bezel structure may form the side surface of the electronic device 200. When viewing the electronic device 200 in the +x axis direction in FIG. 2A, a portion of the third side housing part 213 may form a third side surface 243 between the first curved part 230b of the screen 2301 and the third curved part 201b of the rear surface 201. When viewing the electronic device 200 in the −x axis direction in FIG. 2A, a portion of the fourth side housing 214 may form a fourth side surface (not illustrated) between the second curved part 230c of the screen 2301 and the fourth curved part 201c of the rear surface 201. The first side housing part 211 may form a first side surface (not illustrate) connecting one end of the third side surface 243 and one end of the fourth side surface. The second side housing part 212 may form a second side surface 242 connecting the other end of the third side surface 243 and the other end of the fourth side surface.

Referring to the closed state of the electronic device 200 illustrated in FIG. 2A, in an embodiment of the disclosure, when viewed from above the first flat part 230a of the screen 2301, the first side housing part 211 may form a first screen periphery part 261 corresponding to a first side of the screen 2301, and the second side housing part 212 may form a second screen periphery part 262 corresponding to a second side of the screen 2301 positioned opposite to the first side. The sliding plate 200 may form a third screen periphery part (not illustrated) corresponding to a third side of the screen 2301. The third screen periphery part may form a surface smoothly connecting the second curved part 230c of the screen 2301 and a fourth side surface formed by the fourth side housing part 214 in the state in which the electronic device 200 is closed.

According to an embodiment of the disclosure, the sliding structure related to the flexible display 230 may include an elastic structure. For example, when the flexible display 230 is moved by an external force to a set distance, the flexible display 230 may be switched from the closed state to the open state or from the open state to a closed state due to the elastic structure included in the sliding structure without any further external force (e.g., a semi-automatic slide operation).

According to some embodiments of the disclosure, when a signal is generated through an input device included in the electronic device 200, the electronic device 200 may be switched from the closed state to the open state or from the open state to the closed state due to a driving device, such as a motor connected to the flexible display 230. For example, when a signal is generated through a hardware button or a software button provided through a screen, the electronic device 200 may be switched from the closed state to the open state or from the open state to the closed state.

According to various embodiments of the disclosure, when a signal is generated from various sensors, such as a pressure sensor, the electronic device 200 may be switched from the closed state to the open state, or from the open state to the closed state. For example, when carrying or grasping the electronic device 200 by hand, a squeeze gesture in which a portion of the hand (e.g., the palm or fingers) presses within a predetermined section of the electronic device 200 may be detected by a sensor, and in response thereto, the electronic device 200 may be switched from the closed state to the open state or from the open state to the closed state.

According to various embodiments of the disclosure, when the second area ② of the flexible display 230 is inserted into the inner space of the housing 210 (e.g., the closed state), at least a portion of the second area ② may be disposed to be visible from the outside through the back cover 215. In this case, the back cover 215 may be formed of a transparent material and/or a translucent material.

According to an embodiment of the disclosure, the electronic device 200 may include a pulley (or a roller) located inside the electronic device 200 to correspond to the second area ② of the flexible display 230. The second area ② of the flexible display 230 may be drivingly connected to the pulley, and the movement and the movement direction of the second area ② may be guided through the rotation of the pulley during the switching between the closed state of FIG. 2A and the open state of FIG. 3A. The first curved part 230b of the screen 2301 may be formed by a portion of the second area ② corresponding to the curved surface of the pulley. The second curved part 230c of the screen 2301 may be formed to correspond to a curved surface formed on one surface of the sliding plate 220. The second curved part 230c may be positioned opposite to the first curved part 230b in the closed or the open state of the electronic device 200 so as to improve the aesthetics of the screen 2301. According to some embodiments of the disclosure, the first flat part 230a may be implemented in an expanded form without the second curved part 230c.

According to an embodiment of the disclosure, the flexible display 230 may further include a touch-sensitive circuit (e.g., a touch sensor). According to various embodiments (not illustrated) of the disclosure, the flexible display 230 may be coupled to or disposed adjacent to a pressure sensor capable of measuring the intensity (pressure) of a touch, and/or a digitizer configured to detect a magnetic-field-type pen input device (e.g., a stylus pen). For example, the digitizer may include a coil member disposed on a dielectric substrate to detect a resonance frequency of an electromagnetic induction scheme applied from a pen input device.

According to an embodiment of the disclosure, the electronic device 200 may include a camera module 271 (e.g., the camera module 180 in FIG. 1) or a flash 272. The flash 272 may be implemented to be included in the camera module 271. The camera module 271 and/or the flash 272 may be located, for example, on the rear surface 201 of the electronic device 200. The camera module 271 may include one or more lenses, an image sensor, and/or an image signal processor. The flash 272 may include, for example, a light-emitting diode or a xenon lamp. According to various embodiments of the disclosure, the electronic device 200 may include a plurality of camera modules without being limited to the embodiment of FIG. 2B or 3B. For example, a plurality of camera modules (e.g., dual cameras, or triple cameras) may have different properties (e.g., angle of view) or functions. According to an embodiment of the disclosure, a plurality of camera modules including lenses having different angles of view may be configured, and the electronic device 200 is capable of controlling the camera modules to change the angle of view of the camera modules operated therein based on a user's selection. As another example, the plurality of camera modules may include at least one of a wide-angle camera, a telephoto camera, a color camera, a monochrome camera, or an infrared (IR) camera (e.g., a time of flight (TOF) camera, or a structured light camera). In various embodiments of the disclosure, the IR camera may be operated as at least part of a sensor module (not illustrated).

According to various embodiments (not illustrated) of the disclosure, the electronic device 200 may include another camera (e.g., a front camera module) configured to generate an image signal based on light received through one surface of the electronic device 200 placed in a direction in which the screen 2301 is oriented. For example, the front camera module may be positioned inside the electronic device 200 to correspond to the first screen periphery part 261. As another example, the front camera module may be positioned inside the electronic device 200 to be aligned with an opening (e.g., a through hole or a notch) formed in the flexible display 230. In this case, external light may pass through the opening and an area of the transparent cover overlapping the opening, and may flow into the front camera module. The transparent cover serves to protect the flexible display 230 from the outside, and may include a flexible member, such as a plastic film (e.g., a polyimide film) or an ultra-thin glass (UTG).

According to some embodiments of the disclosure, the front camera module may be disposed under at least a portion of the screen 2301, and may perform a related function (e.g., image capture) in the state in which the position of the front camera module is not visually distinguished (or exposed). For example, the front camera module may be positioned on the rear surface of the screen 2301 or below or beneath the screen 2301. According to various embodiments of the disclosure, the front camera module may be positioned in alignment with a recess formed in the rear surface of the flexible display 230. When viewed from above the screen 2301 (e.g., when viewed in the −z axis direction), the front camera module may be disposed to overlap at least a portion of the screen 2301 so as to obtain an image of an external subject without being exposed to the outside. In this case, a partial area of the flexible display 230 that at least partially overlaps the front camera module may include a different pixel structure and/or a wiring structure different from those of other areas. For example, the partial area of the flexible display 230 that at least partially overlaps the front camera module may have a pixel density different from that of other areas. A pixel structure and/or a wiring structure formed in a partial area of the flexible display 230 that at least partially overlaps the front camera module may reduce light loss between the outside and the front camera module. According to some embodiments of the disclosure, pixels may not be disposed in a partial area of the flexible display 230 that at least partially overlaps the front camera module.

According to various embodiments (not illustrated) of the disclosure, the electronic device 200 may include various sensor modules (e.g., the sensor module 176 in FIG. 1). A sensor module may generate electrical signals or data values corresponding to the internal operating states or the external environmental states of the electronic device 200. The sensor module may include at least one of, for example, a proximity sensor, a gesture sensor, a gyro sensor, an atmospheric pressure sensor, a magnetic sensor, an acceleration sensor, a grip sensor, a color sensor, an infrared (IR) sensor, a biometric sensor (e.g., a fingerprint sensor or an HRM sensor), a temperature sensor, a humidity sensor, or an illuminance sensor. According to an embodiment of the disclosure, the sensor module may be positioned inside the electronic device 200 to correspond to the first screen periphery part 261. According to another embodiment of the disclosure, the sensor module may include an optical sensor, and may be positioned inside the electronic device 200 to be aligned with an opening (e.g., a through hole or a notch) formed in the flexible display 230. In this case, external light may pass through the opening and an area of the transparent cover overlapping the opening, and may flow into the optical sensor.

According to some embodiments of the disclosure, the sensor module may be disposed under at least a portion of the screen (e.g., a screen display area or an active area) 2301 of the flexible display 230, and may perform a related function in the state in which the position of the sensor module is visually distinguished (or exposed). For example, the sensor module may be positioned on the rear surface of the screen 2301 of the flexible display 230 or below or beneath the screen 2301 of the flexible display 230. According to various embodiments of the disclosure, the sensor module may be positioned in alignment with a recess formed in the rear surface of the flexible display 230. When viewed from above the screen 2301 (e.g., when viewed in the −z axis direction), the sensor module may be disposed to overlap at least a portion of the screen 2301 so as to perform a corresponding function without being exposed to the outside. In this case, the partial area of the flexible display 230 that at least partially overlaps the sensor module may include a different pixel structure and/or a wiring structure different from those of other areas. For example, the partial area of the flexible display 230 that at least partially overlaps the sensor module may have a pixel density different from that of other areas. The pixel structure and/or the wiring structure formed in a partial area of the flexible display 230 that is at least partially overlap the sensor module may reduce losses of various types of signals (e.g., light or ultrasonic waves) related to the sensor module when the signals pass a space between the outside and the sensor module. According to some embodiments of the disclosure, pixels may not be disposed in the partial area of the flexible display 230 that at least partially overlaps the sensor module.

According to various embodiments (not illustrated) of the disclosure, the electronic device 200 may further include a key input device (e.g., the input module 150 in FIG. 1). The key input device may be positioned on a first side of the electronic device 200 formed by, for example, a first side cover. In some embodiments (not illustrated) of the disclosure, the key input device may include at least one sensor module.

According to various embodiments of the disclosure, the electronic device 200 may omit at least one of the above-mentioned components or may additionally include another component. For example, the electronic device 200 may include a microphone positioned inside the housing 210 and a microphone hole formed in the housing 210 to correspond to the microphone. According to some embodiments of the disclosure, the electronic device 200 may include a plurality of microphones capable of detecting the direction of sound. For example, the electronic device 200 may include a speaker positioned inside the housing 210 and a speaker hole formed in the housing 210 to correspond to the microphone. For example, the electronic device 200 may include a call receiver positioned inside the housing 210 and a receiver hole formed in the housing 210 to correspond to the call receiver. In some embodiments of the disclosure, the microphone hole and the speaker hole may be implemented as one hole, or the speaker hole may be omitted, as in a piezo speaker. For example, the electronic device 200 may include a connector (e.g., a USB connector) positioned inside the housing 210 and a connector hole formed in the housing 210 to correspond to the connector. The electronic device 200 may transmit and/or receive power and/or data to and from an external electronic device electrically connected to the connector through the connector hole.

Figure 4:
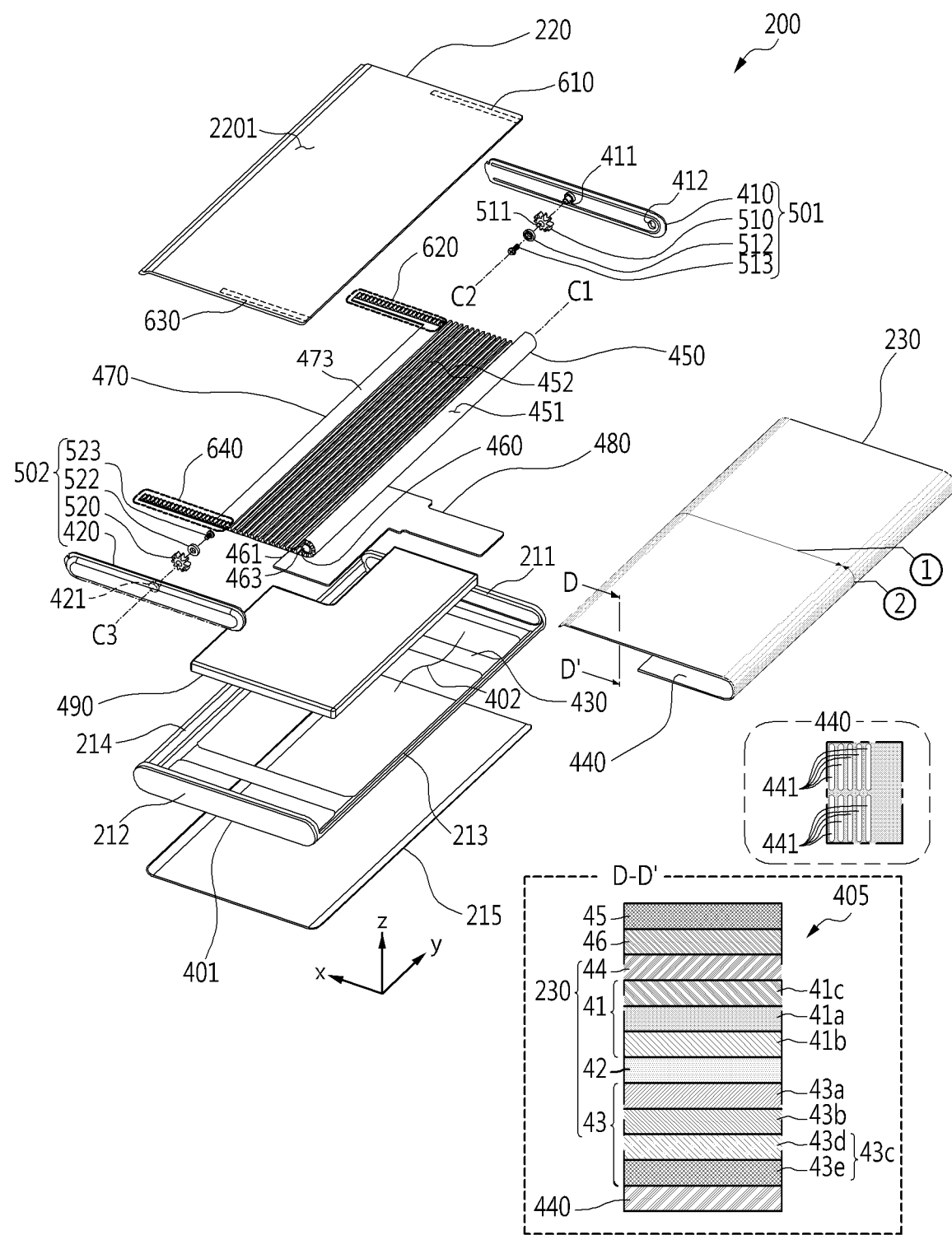
FIG. 4 is an exploded perspective view of an electronic device of FIG. 2A according to an embodiment of the disclosure.

FIG. 4 is an exploded perspective view of an electronic device 200 of FIG. 2A according to an embodiment of the disclosure.

Referring to FIG. 4, in an embodiment of the disclosure, the electronic device 200 may include a bezel structure 401, a back cover 215, a first support member 410, a second support member 420, a third support member 430, a sliding plate 220, a flexible display 230, a support sheet 440, a multi-bar structure (or a multi-bar assembly) 450, a pulley 460, a first circular gear or round gear 510, a second circular gear 520, a first linear gear 610, a third linear gear 630, a linear gear structure 470, a printed circuit board 480 (e.g., a printed circuit board (PCB), a flexible PCB (FPCB), or a rigid-flexible PCB (RFPCB)), or a battery 490. A side bezel structure 601 may include a first side housing part 211, a second side housing part 212, a third side housing part 213, and/or a fourth side housing part 214. Redundant descriptions of some of the reference numerals of FIG. 4 will be omitted.

According to an embodiment of the disclosure, the first support member 410, the second support member 420, and/or the third support member 430 form a frame structure capable of withstanding a load and may be coupled the bezel structure 401 to serve to ensure the durability or rigidity of the electronic device 200. At least a portion of the first support member 410, the second support member 420, and/or the third support member 430 may include a non-metallic material (e.g., a polymer) or a metallic material. According to some embodiments of the disclosure, the first support member 410, the second support member 420, and the third support member 430 may be integrally formed, and may include the same material.

According to an embodiment of the disclosure, the first support member (e.g., a first bracket) 410 may be positioned inside the electronic device 200, and may be coupled to the first side housing part 211. The second support member (e.g., a second bracket) 420 may be positioned inside the electronic device 200, and may be coupled to the second side housing part 212. For example, in a fastening method, such as snap-fit, the first support member 410 may be coupled to the first side housing part 211, and the second support member 420 may be coupled to the second side housing part 212. As another example, an adhesive material may be disposed between the first support member 410 and the first side housing part 211, and/or between the second support member 420 and the second side housing part 212. According to some embodiments of the disclosure, the first support member 410 and the first side housing part 211 may be integrally formed, and may include the same material. According to some embodiments of the disclosure, the second support member 420 and the second side housing part 212 may be integrally formed, and may include the same material.

According to an embodiment of the disclosure, the third support member (e.g., a third bracket) 430 may be positioned inside the electronic device 200, and may be coupled to the bezel structure 401. According to an embodiment of the disclosure, the bezel structure 401 and the third support member 430 may be integrally formed, and may include the same material.

According to an embodiment of the disclosure, the back cover 215 may be coupled to the third support member 410 and/or the bezel structure 401, and may form the exterior of the electronic device 200 together with the bezel structure 401. The printed circuit board 480 and/or the battery 490 may be disposed on or coupled to the third support member 430 in the inner space of the electronic device 200. The printed circuit board 480 and the battery 490 may not overlap each other when viewed from above the back cover 215 (e.g., viewed in the +z axis direction). The printed circuit board 480 may be electrically connected to the flexible display 230 via, for example, a flexible printed circuit board (FPCB) (not illustrated). A processor (e.g., the processor 120 in FIG. 1), memory (e.g., the memory 130 in FIG. 1), and/or an interface (e.g., the interface 177 in FIG. 1) may be mounted on the printed circuit board 480. The processor may include at least one of, for example, a central processing unit, an application processor, a graphics processor, an image signal processor, a sensor hub processor, or a communication processor. The memory may include, for example, a volatile memory or a nonvolatile memory. The interface may include, for example, a high-definition multimedia interface (HDMI), a universal serial bus (USB) interface, an SD card interface, and/or an audio interface. The interface may electrically or physically connect, for example, the electronic device 200 to an external electronic device, and may include a USB connector, an SD card/MMC connector, or an audio connector. The electronic device 200 may include various other elements disposed on the printed circuit board 480 or electrically connected to the printed circuit board 480. The battery 490 is a device for supplying power to at least one component of the electronic device 200, and may include, for example, a non-rechargeable primary battery, a rechargeable secondary battery, or a fuel cell. The battery 490 may be integrally disposed inside the electronic device 200, or may be detachably disposed on the electronic device 200.

According to various embodiments (not illustrated) of the disclosure, the electronic device 200 may include an antenna positioned between the third support member 430 and the back cover 215. The antenna may include, for example, a nearfield communication (NFC) antenna, a wireless charging antenna, and/or a magnetic secure transmission (MST) antenna. The antenna may perform short-range communication with, for example, an external electronic device, or may transmit/receive power required for charging to/from an external device in a wireless manner. In another embodiment of the disclosure, an antenna structure may be formed by at least a portion of the bezel structure 401.

According to an embodiment of the disclosure, the first support member 410 and the second support member 420 may be positioned to be spaced apart from each other in a second direction (e.g., the y axis direction) orthogonal to the first direction in which the sliding plate 220 can slide out (e.g., the +x axis direction). The first support member 410 and the second support member 420 are substantially symmetrical to each other with reference to the center line C (see FIG. 2A, 2B, 3A, or 3B) of the electronic device 200 extending in the first direction. The center line C of the electronic device 200 may be, for example, a line serving as a reference for symmetry with respect to the first flat part 230a of the screen 2301.

According to an embodiment of the disclosure, the flexible display 230 may include a first area ① and a second area ② extending from the first area ①. The first area ① may be disposed to overlap the sliding plate 220. The sliding plate 220 may include a first surface 2201 and a second surface (not illustrated) positioned opposite to the first surface 2201. The first area ① may be coupled to the first surface 2201 of the sliding plate 220 using an adhesive member (or a bonding member) (not illustrated). The adhesive member may include, for example, a thermally reactive adhesive member, a photoreactive adhesive member, a general adhesive and/or a double-sided tape. According to some embodiments of the disclosure, the first area ① may be disposed in and fixed to a recess formed in the sliding plate 220. The sliding plate 220 serves to support at least a portion of the flexible display 230, and may be referred to as a display support plate in some embodiments. When switching from the closed state of FIG. 2A to the open state of FIG. 3A, the second area ② connected to the first area ① may slide out and thus the screen may be expanded due to the movement of the sliding plate 220 (see the screen 2301 in FIG. 3A). When switching from the open state of FIG. 2A to the closed state of FIG. 3A, the second area ② may be at least partially introduced into the space between the bezel structure 401 and the third support member 430 due to the movement of the sliding plate 220, and thus the screen may be contracted (see the screen 2301 of FIG. 2A).

According to an embodiment of the disclosure, the support sheet 440 may be disposed on or coupled to the rear surface of the flexible display 230. The rear surface of the flexible display 230 may refer to a surface positioned opposite to a surface from which light from a display panel including a plurality of pixels is emitted. The support sheet 440 may serve to ensure durability of the flexible display 230. The support sheet 440 may reduce the influence of a load or stress that may occur during switching between the closed state of FIG. 2A and the open state of FIG. 3A on the flexible display 230. The support sheet 440 may prevent the flexible display 230 from being damaged by a force transmitted from the sliding plate 220 when the sliding plate 220 is moved.

In FIG. 4, the cross-sectional structure 405 obtained along line D-D' may include, for example, a flexible display 230, a transparent cover 45, an optical transparent adhesive member 46, and a support sheet 440. The flexible display 230 may be coupled to the transparent cover 45 using an optically transparent adhesive member 46 (e.g., an optically clear adhesive (OCA) or an optically clear resin (OCR), or a super view resin (SVR)). The transparent cover 45 (e.g., a window) may cover the flexible display 230 to protect the flexible display 230 from the outside. The transparent cover 45 may be implemented in the form of a thin film having flexibility (e.g., a thin film layer). For example, the transparent cover 45 may include a plastic film (e.g., polyimide film) or thin glass (e.g., ultra-thin glass). According to an embodiment of the disclosure, the transparent cover 45 may include a plurality of layers. For example, the transparent cover 45 may have a form in which various coating layers are disposed on a plastic film or a thin-film glass. For example, the transparent cover 45 may have a form in which at least one protective layer or coating layer containing a polymer material (e.g., polyester (PET), polyimide (PI), or thermoplastic polyurethane (TPU)) is disposed on a plastic film or a thin-film glass.

According to an embodiment of the disclosure, the flexible display 230 may include a display panel 41, a base film 42, a lower panel 43, or an optical layer 44. The display panel 41 may be positioned between the optical layer 44 and the base film 42. The base film 42 may be positioned between the display panel 41 and the lower panel 43. The optical layer 44 may be positioned between the optically transparent adhesive member 46 and the display panel 41. Between the display panel 41 and the base film 42, between the base film 42 and the lower panel 43, and/or between the display panel 41 and the optical layer 46, various polymer adhesive members (not illustrated) may be disposed.

According to an embodiment of the disclosure, the display panel 41 may include a light-emitting layer 41a and a thin film transistor (TFT) film 41b. The light-emitting layer 41a may include, for example, a plurality of pixels implemented by light-emitting elements, such as OLEDs or micro LEDs. The light-emitting layer 41a may be disposed on the TFT film 41b through organic material evaporation. The TFT film 41b may be positioned between the light-emitting layer 41a and the base film 42. The TFT film 41b may refer to a structure in which at least one TFT is disposed on a flexible substrate (e.g., a PI film) through a series of processes, such as deposition, patterning, and etching. At least one TFT may control current to a light-emitting element of the light-emitting layer 41a to turn on or off a pixel or to adjust brightness of a pixel. At least one TFT may be implemented by, for example, an amorphous silicon (a-Si) TFT, a liquid crystalline polymer (LCP) TFT, a low-temperature polycrystalline oxide (LTPO) TFT, or a low-temperature polycrystalline silicon (LTPS) TFT. The display panel 41 may include a storage capacitor, and the storage capacitor may maintain a voltage signal to the pixel, may maintain a voltage applied to the pixel within one frame, or may reduce a change in the gate voltage of the TFT due to leakage during a light emission time. By a routine for controlling at least one TFT (e.g., initialization or data write), the storage capacitor is able to maintain the voltage applied to a pixel at regular time intervals. According to an embodiment of the disclosure, the display panel 41 may be implemented based on an OLED, and may include an encapsulation layer (e.g., a thin-film encapsulation (TFE) layer) 41c covering the light-emitting layer 41a. An organic material and an electrode that emit light in an OLED react very sensitively with oxygen and/or moisture, and may lose their luminous properties. According to an embodiment of the disclosure, the encapsulation layer 41c may seal the light-emitting layer 41a such that oxygen and/or moisture do not penetrate into the OLED.

According to an embodiment of the disclosure, the base film 42 may include a flexible film formed of a material, such as polyimide or polyester (PET). The base film 42 may support and protect the display panel 41. According to some embodiments of the disclosure, the base film 42 may be referred to as a protective film, a back film, or a back plate.

According to an embodiment of the disclosure, the lower panel 43 may include a plurality of layers for various functions. Various polymer adhesive members (not illustrated) may be disposed between the plurality of layers. According to an embodiment of the disclosure, the lower panel 43 may include a light-blocking layer 43a, a buffer layer 43b, or a lower layer 43c. The light-blocking layer 43a may be positioned between the base film 42 and the buffer layer 43b. The buffer layer 43b may be positioned between the light-blocking layer 43a and the lower layer 43c. The light-blocking layer 43a may block at least some of light incident from the outside. For example, the light-blocking layer 43a may include an embossed layer. The embossing layer may be a black layer including an uneven pattern. The buffer layer 43b may alleviate an external impact applied to the flexible display 230. For example, the buffer layer 43b may include a sponge layer or a cushion layer. The lower layer 43c may diffuse, disperse, or dissipate heat generated from the electronic device 200 or the flexible display 230. The lower layer 43c may absorb or block electromagnetic waves. The lower layer 43c may alleviate an external impact applied to the electronic device 200 or the flexible display 230. For example, the lower layer 43c may include a composite sheet 43d or a copper sheet 43e. According to an embodiment of the disclosure, the composite sheet 43d may be a sheet obtained by combining layers or sheets having different properties. For example, the composite sheet 43d may include at least one of polyimide and graphite. The composite sheet 43d may also be replaced by a single sheet containing a single material (e.g., polyimide or graphite).

The composite sheet 43d may be positioned between the buffer layer 43b and the copper sheet 43e. The copper sheet 43e may be replaced with a variety of other metal sheets. According to various embodiments of the disclosure, at least a portion of the lower layer 43c is a conductive member (e.g., a metal plate), which may help reinforce the rigidity of the electronic device 200, may be used in order to block ambient noise and to dissipate heat emitted from surrounding heat-emitting components (e.g., a display-driving circuit (e.g., a DDI)). For example, the conductive layer may include at least one of copper (Cu), aluminum (Al), stainless steel (SUS), or a CLAD (e.g., a lamination member in which SUS and Al are alternately disposed). The lower layer 43c may include various layers for various other functions.

According to various embodiments (not illustrated) of the disclosure, at least one additional polymer layer (e.g., a layer including PI, PET, or TPU) may be further disposed on the rear surface of the display panel 41 in addition to the base film 42. According to various embodiments of the disclosure, at least one of the plurality of layers included in the lower panel 43 (e.g., the light-blocking layer 43a, the buffer layer 43b, the composite sheet 43d, and the copper sheet 43e) may be omitted. According to various embodiments of the disclosure, the arrangement order of the plurality of layers included in the lower panel 43 is not limited to the embodiment of FIG. 4, and may be variously changed.

The optical layer 44 may include, for example, a polarizing layer (or a polarizer) or a phase retardation layer (or a phase retarder). The polarization layer and the phase retardation layer may improve outdoor visibility of a screen. According to an embodiment of the disclosure, the optical layer 44 may selectively pass light generated from a light source of the display panel 41 and vibrating in a predetermined direction. According to some embodiments of the disclosure, a single layer obtained by combining a polarizing layer and a phase retardation layer may be provided, and such a layer may be defined as a "circularly polarizing layer". The optically transparent adhesive member 46 may be positioned between the transparent cover 45 and the optical layer 44. According to various embodiments of the disclosure, the polarizing layer (or circularly polarizing layer) may be omitted, and in this case, a black pixel define layer (PDL) and/or a color filter may be provided in place of the polarizing layer.

According to an embodiment (not illustrated) of the disclosure, the electronic device 200 may include a touch-sensitive circuit (e.g., a touch sensor). The touch-sensitive circuit may be implemented as a transparent conductive layer (or film) based on various conductive materials, such as indium tin oxide (ITO). According to an embodiment of the disclosure, the touch-sensitive circuit may be positioned between the transparent cover 45 and the optical layer 44 (e.g., an add-on type). According to another embodiment of the disclosure, the touch-sensitive circuit may be disposed between the optical layer 44 and the display panel 41 (e.g., an on-cell type). According to another embodiment of the disclosure, the display panel 41 may include a touch-sensitive circuit or a touch-sensitive function (e.g., an in-cell type). According to various embodiments of the disclosure, the display panel 41 may be based on an OLED, and may include an encapsulation layer 41c disposed between the light-emitting layer 41a and the optical layer 44. For example, the encapsulation layer 41c may serve as a pixel protection layer for protecting a plurality of pixels of the light-emitting layer 41a. According to various embodiments (not illustrated) of the disclosure, the flexible display 230 may include a conductive pattern, such as a metal mesh (e.g., an aluminum metal mesh) as a touch-sensitive circuit disposed on the encapsulation layer 41c between the encapsulation layer 41c and the optical layer 44. For example, in response to the bending of the flexible display 230, the metal mesh may have greater durability than a transparent conductive layer made of ITO. According to various embodiments (not illustrated) of the disclosure, the flexible display 230 may further include a pressure sensor capable of measuring the intensity (pressure) of a touch.

According to various embodiments of the disclosure, a plurality of layers included in the display panel 41 or the lower panel 41, or a laminating structure or laminating order thereof may vary. According to various embodiments of the disclosure, the flexible display 41 may be implemented by omitting some of the components or adding other components according to the form of provision thereof or the trend of convergence.

According to an embodiment of the disclosure, the support sheet 440 may be attached to the rear surface of the lower panel 43 to cover at least a portion of the lower panel 43 of the flexible display 230. The support sheet 440 may be formed of various metallic materials and/or non-metal materials (e.g., polymers). According to an embodiment of the disclosure, the support sheet 440 may include stainless steel. According to another embodiment of the disclosure, the support sheet 440 may include engineering plastic. According to some embodiments of the disclosure, the support sheet 440 may be implemented integrally with the flexible display 230.

According to an embodiment of the disclosure, the support sheet 440 may include a lattice structure that at least partially overlaps a portion in which the flexible display 230 is bent and disposed (e.g., the second area ②, or the second curved part 230c in FIG. 2A or 3A). The lattice structure may include, for example, a plurality of openings (or slits) 441. For example, the plurality of openings 441 may be formed periodically, may have substantially the same shape, and may be repeatedly arranged at regular intervals. The lattice structure may serve to ensure the flexibility of the second area ②, and the second area ② may be more flexible than the first area ① due to the lattice structure. The lattice structure is not limited to the embodiment of FIG. 4, and may be implemented in various other forms. According to various embodiments of the disclosure, the support sheet 440 may include a recess pattern (not illustrated) including a plurality of recesses, replacing the lattice structure. According to various embodiments of the disclosure, the lattice structure or recess pattern contributing to the flexibility of the flexible display 230 may extend to at least a portion of the first flat part 230a in FIG. 2A or 3A. According to various embodiments of the disclosure, the support sheet 440 including a lattice structure or a recess pattern, or a conductive member corresponding thereto, may be formed of a plurality of layers.

According to an embodiment of the disclosure, the support sheet 440 may substantially prevent elements positioned inside the electronic device 200 (e.g., the multi-bar structure 450) from being viewed through the flexible display 230. For example, the lattice structure of the support structure 440 corresponding to the second area ② includes a plurality of openings 441, but the multi-bar structure 450 is capable of transmitting light at a level that makes the multi-bar structure 450 substantially invisible through the flexible display 230. According to various embodiments of the disclosure, the lattice structure of the support structure 440 corresponding to the second area ② includes a plurality of openings 441, but is capable of preventing a phenomenon in which the plurality of bars of the multi-bar structure 440 protrude through the flexible display 230.

According to an embodiment of the disclosure, the multi-bar structure 450 may include a third surface 451 facing the support sheet 440, and a fourth surface 452 positioned opposite to the third surface 451. When the state of the electronic device 200 changes, the multi-bar structure 450 may move together with the sliding plate 220 and the flexible display 230. The state change of the electronic device 200 may include, for example, switching between the closed state and the open state, switching between the closed state and the intermediate state, or switching between the closed state and the open state. For example, the multi-bar structure 450 may be coupled to the support sheet 440, and an adhesive material may be positioned between the third surface 451 and the support sheet 440. For example, the multi-bar structure 450 may be connected to the sliding plate 220. When the state of the electronic device 200 changes, the multi-bar structure 450 may move while rotating the pulley 460 rubbing against the fourth surface 452. The movement and the movement direction of the multi-bar structure 450 may be guided by the pulley 460. According to an embodiment of the disclosure, the fourth surface 452 may take a form in which a plurality of bars (not illustrated) are arranged to extend in the direction of the axis of rotation of the pulley 460 (e.g., the y-axis direction). The multi-bar structure 450 may have flexibility due to, for example, portions having a relatively thin thickness between a plurality of bars. According to some embodiments of the disclosure, the multi-bar structure 450 is an element supporting the flexible display 230, and may be referred to as a "display support structure". In various embodiments of the disclosure, the multi-bar structure 450 may also be referred to in various other terms, such as a "flexible track". In various embodiments of the disclosure, various other flexible members may be provided to replace the multi-bar structure 450.

According to an embodiment of the disclosure, in the closed state of FIG. 2A or the open state of FIG. 3A, at least a portion of the multi-bar structure 450 is positioned to overlap the screen 2301 (see FIG. 2A or 3A), and may support the second area ② of the flexible display 230 such that the second area ② is maintained in a shape smoothly connected to the first area ① of the flexible display 230 without being lifted. The multi-bar structure 450 is capable of contributing to the function of enabling the second area ② to move while maintaining the shape smoothly connected to the first area ① without being lifted during the switching between the closed state of FIG. 2A and the open state of FIG. 3A.

According to an embodiment of the disclosure, the pulley 460 may be positioned in the space 402 between the bezel structure 401 and the third support member 430 to correspond to the second area ② of the flexible display 230. During the switching between the closed state of FIG. 2A and the open state of FIG. 3A, the second area ② is capable of moving while rotating the pulley 460. The movement and the movement direction of the second area ② may be guided by the pulley 460. The pulley 460 may include, for example, a cylindrical roller 461 extending in a direction oriented from the second support member 420 toward the first support member 410 (e.g., the +y axis direction). The pulley 460 may include a first rotation shaft (not illustrated) and a second rotation shaft 463 connected to the cylindrical roller 461, and the first rotation shaft and the second rotation shaft 463 may be positioned opposite to each other, with the cylindrical roller 461 interposed therebetween. The first rotation shaft may be positioned between the cylindrical roller 461 and the first side housing part 211, and may be connected to the first support member 410. The second rotation shaft 463 may be positioned between the cylindrical roller 461 and the second side housing part 212, and may be connected to the second support member 420. The first support member 410 may include a first through hole 412 (or a first recess) into which the first rotation shaft is inserted, and the second support member 420 may include a second through hole (or a second recess) (not illustrated) into which the second rotation shaft 463 is inserted. The cylindrical roller 461 may be rotatable based on the first rotation shaft disposed on the first support member 410 and the second rotation shaft 463 disposed on the second support member 420.

According to an embodiment of the disclosure, the first circular gear 510 may include, for example, a rotating body in a circular cylinder shape or a disk shape, and gear teeth arranged along the circumference of the rotating body. The first circular gear 510 may be rotatably coupled to the first support member 410. The first support member 410 may include a first shaft 411. The first shaft 411 may be fitted into a through hole (e.g., a shaft hole) 511 formed in the first circular gear 510. A first separation prevention member 512 may be disposed between a first bolt 513 and the first shaft 411, and the first bolt 513 may be fastened to the first shaft 411. The first separation prevention member 512 may include a bolt-fastening hole (not illustrated), and the first shaft 411 may include a bolt-fastening portion (not illustrated) including a female screw capable of being fastened to the first bolt 513. The first circular gear 510 is in a rotatable state with respect to the first shaft 411, and the first separation prevention member 512 coupled to the first shaft 411 by the first bolt 513 is capable of preventing the first circular gear 510 from being separated from the first shaft 411. According to various embodiments of the disclosure, the first separation prevention member 512 may be referred to as various other terms, such as a "first gear cap". An assembly including the first support member 410, the first circular gear 510, the first separation prevention member 512, and the first bolt 513 may be referred to as a "first circular gear assembly 510" hereinafter.

Figure 5:
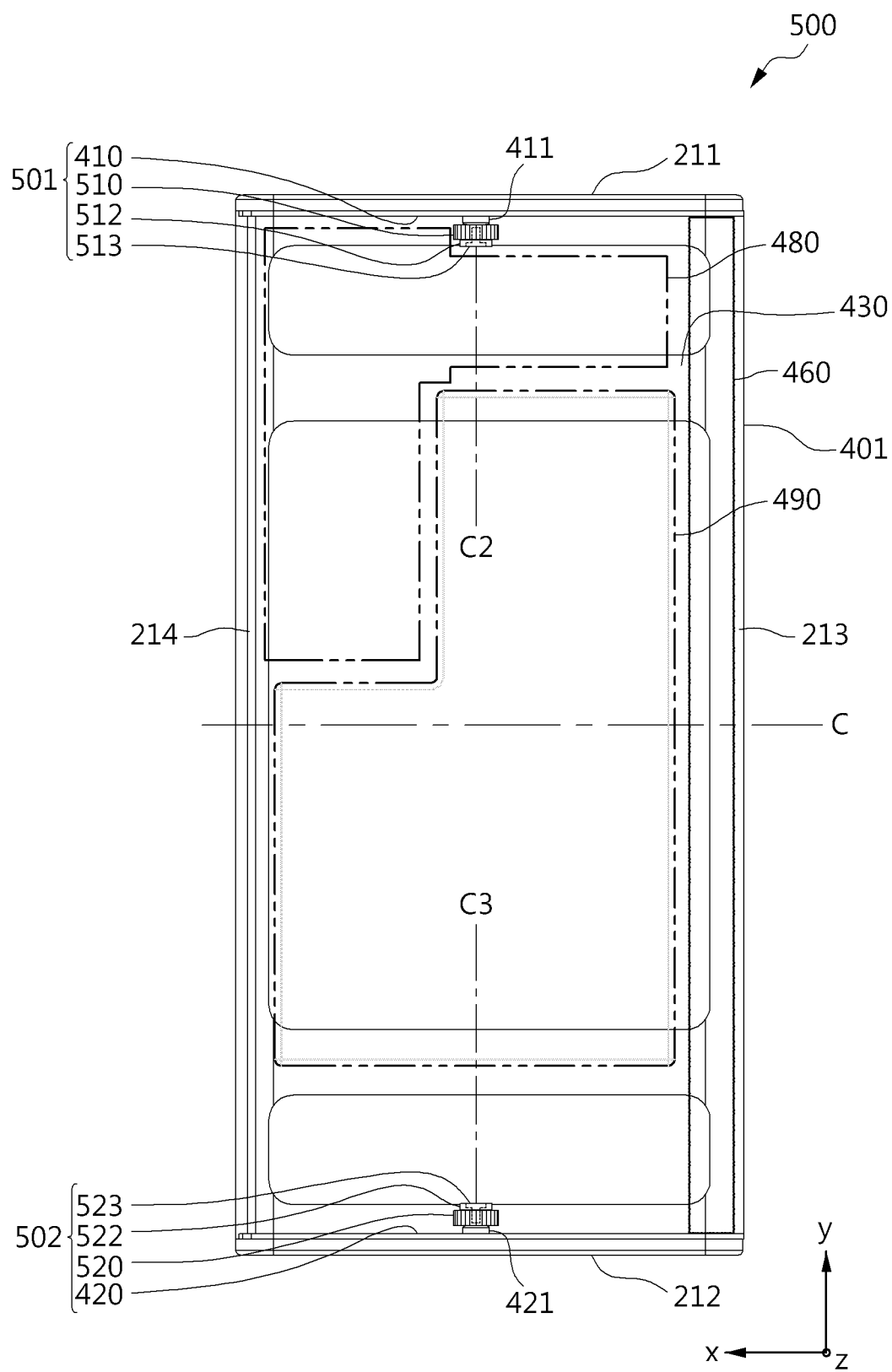
FIG. 5 is a plan view of an assembly including a bezel structure, a first circular gear assembly, a second circular gear assembly, and a third support member according to an embodiment of the disclosure.

FIG. 5 is a plan view of an assembly 500 including a bezel structure 401, a first circular gear assembly 501, a second circular gear assembly 402, and a third support member 430 according to an embodiment of the disclosure. Redundant descriptions of some of the reference numerals of FIG. 5 will be omitted.

Referring to FIGS. 4 and 5, in an embodiment of the disclosure, the second circular gear assembly 502 may be disposed on the second side housing part 212 to be symmetrical to the first circular gear assembly 501 with reference to the center line C of the electronic device 200. The second circular gear assembly 502 may include, for example, a second support member 420, a second circular gear 520, a second separation prevention member (e.g., a second gear cap) 522, and a second bolt 523. The second shaft 421 disposed in the second support member 420 may be fitted into a through hole (e.g., a shaft hole) formed in the second circular gear 520. A second separation prevention member 522 may be disposed between the second bolt 523 and the second shaft 421, and the second bolt 523 may be fastened to the second shaft 421. The second circular gear 520 is in a rotatable state with respect to the second shaft 421, and the second separation prevention member 522 coupled to the second shaft 421 by the second bolt 523 is capable of preventing the second circular gear 520 from being separated from the second shaft 421.

According to an embodiment of the disclosure, the first circular gear 510 and the second circular gear 520 may be the same gears. For example, the first circular gear 510 and the second circular gear 520 may include dedendum circles having the same size, gears of the same shape, and the same number of gear teeth. A dedendum circle means a circle connecting the roots of all teeth in a gear.

According to an embodiment of the disclosure, a second straight line C2 (hereinafter, referred to as a "second rotation center line") serving as a rotation center of the first circular gear 510 and a third straight line C3 serving as a rotation center of the second circular gear 520 (hereinafter, referred to as a "third rotation center line") may coincide with each other. The first straight line C1 (hereinafter, referred to as a "first rotation center line") serving as the rotation center of the pulley 460 may be parallel to the second rotation center line C2 or the third rotation center line C3. The first circular gear 510 and the second circular gear 520 may be positioned to be spaced apart from the pulley 460 in the first direction in which the sliding plate 220 can slide out (e.g., in the +x axis direction).

According to an embodiment of the disclosure, the printed circuit board 480 and the battery 490 may be disposed on or coupled to the third support member 430 in the inner space of the electronic device 200. The first rotation shaft of the pulley 460 may be rotatably coupled to the first support member 410, and the second rotation shaft 463 of the pulley 460 (see FIG. 4) may be rotatably coupled to the second support member 420. The flexible display 230 (FIG. 4) may be drivingly connected to the pulley 460, and may be positioned between the screen 2301 (see FIG. 2A or 3A) formed by the flexible display 230 and the third support member 430.

Figure 6:
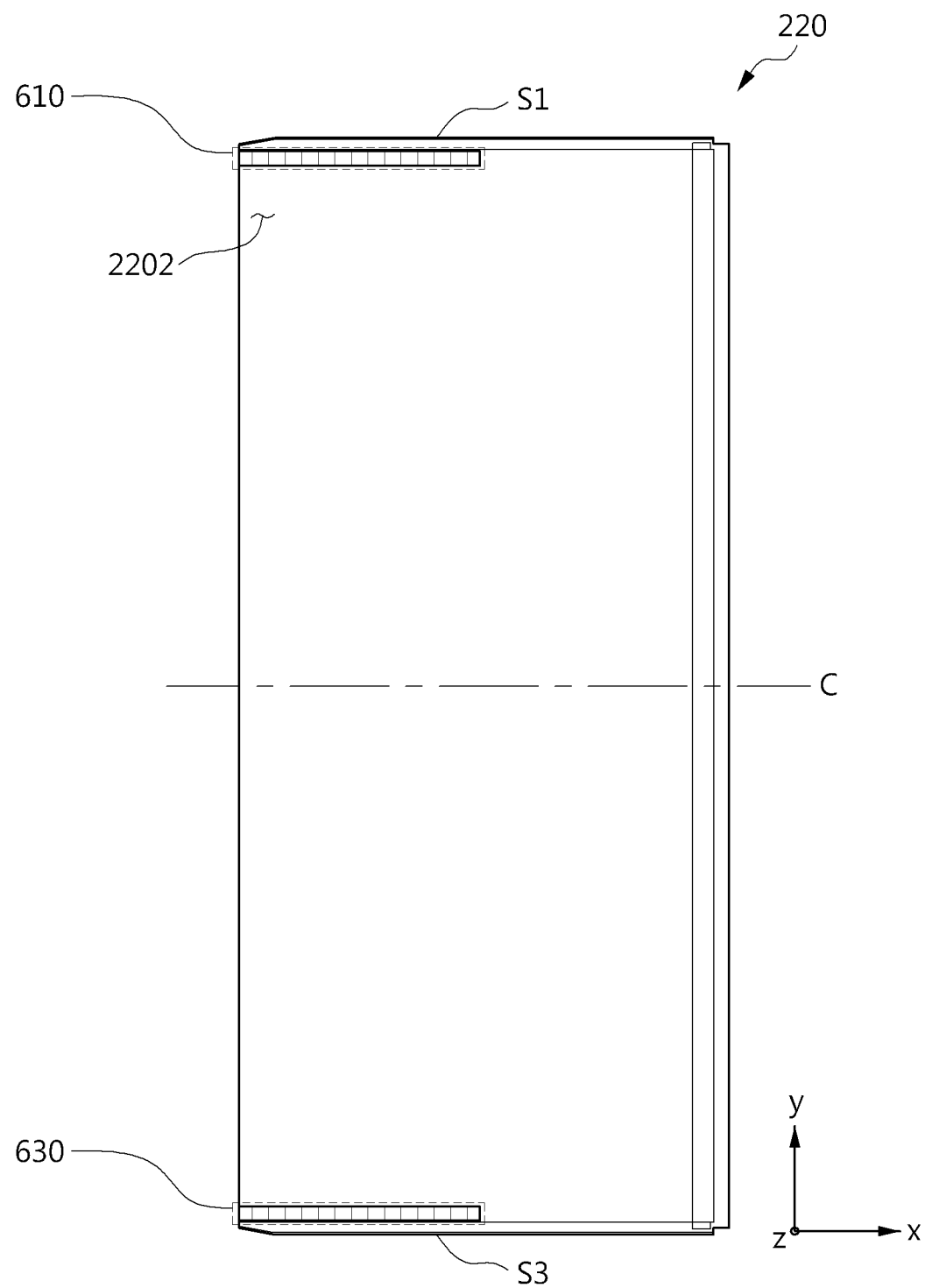
FIG. 6 is a plan view of a sliding plate of FIG. 4 according to an embodiment of the disclosure.

FIG. 6 is a plan view of a sliding plate 220 of FIG. 4 according to an embodiment of the disclosure.

Referring to FIGS. 4 and 6, in an embodiment of the disclosure, the first linear gear 610 and the third linear gear 630 may be positioned on the rear surface of the sliding plate 220 (e.g., a second surface 2202 positioned opposite to the first surface 2201). The first linear gear 610 and the third linear gear 630 may be gear structures in which gear teeth are linearly arranged, for example, in the first direction (e.g., the +x axis direction), in which the sliding plate 220 can slide out, in the flat area of the second surface 2202. The first linear gear 610 and the third linear gear 630 may be symmetrical to each other with respect to the center line C of the electronic device 200. The sliding plate 220 may be implemented to include a first linear gear 610 and a third linear gear 630. According to some embodiments of the disclosure, the first linear gear 610 and the third linear gear 630 may be provided separately from the sliding plate 220, and may be coupled to the sliding plate 220.

According to an embodiment of the disclosure, the sliding plate 220 may include a first slide S1 disposed on a side facing the first support member 410 of FIG. 4. The sliding plate 220 may include a third slide S3 disposed on a side facing the second support member 420 of FIG. 4. The first slide S1 and the third slide S3 may be symmetrical to each other with respect to the center line C of the electronic device 200. The first slide S1 may be positioned on (or inserted into) a first guide rail (or a first rail) disposed on the first support member 410, and the third slide S3 may be positioned on (or inserted into) a second guide rail (or a second rail) disposed on the second support member 420. When the state of the electronic device 200 changes, the first slide S1 is guided and moved by the first guide rail, and the third slide S3 may be guided and moved by the second guide rail, whereby the sliding plate 220 may perform a linear motion.

Figure 7:
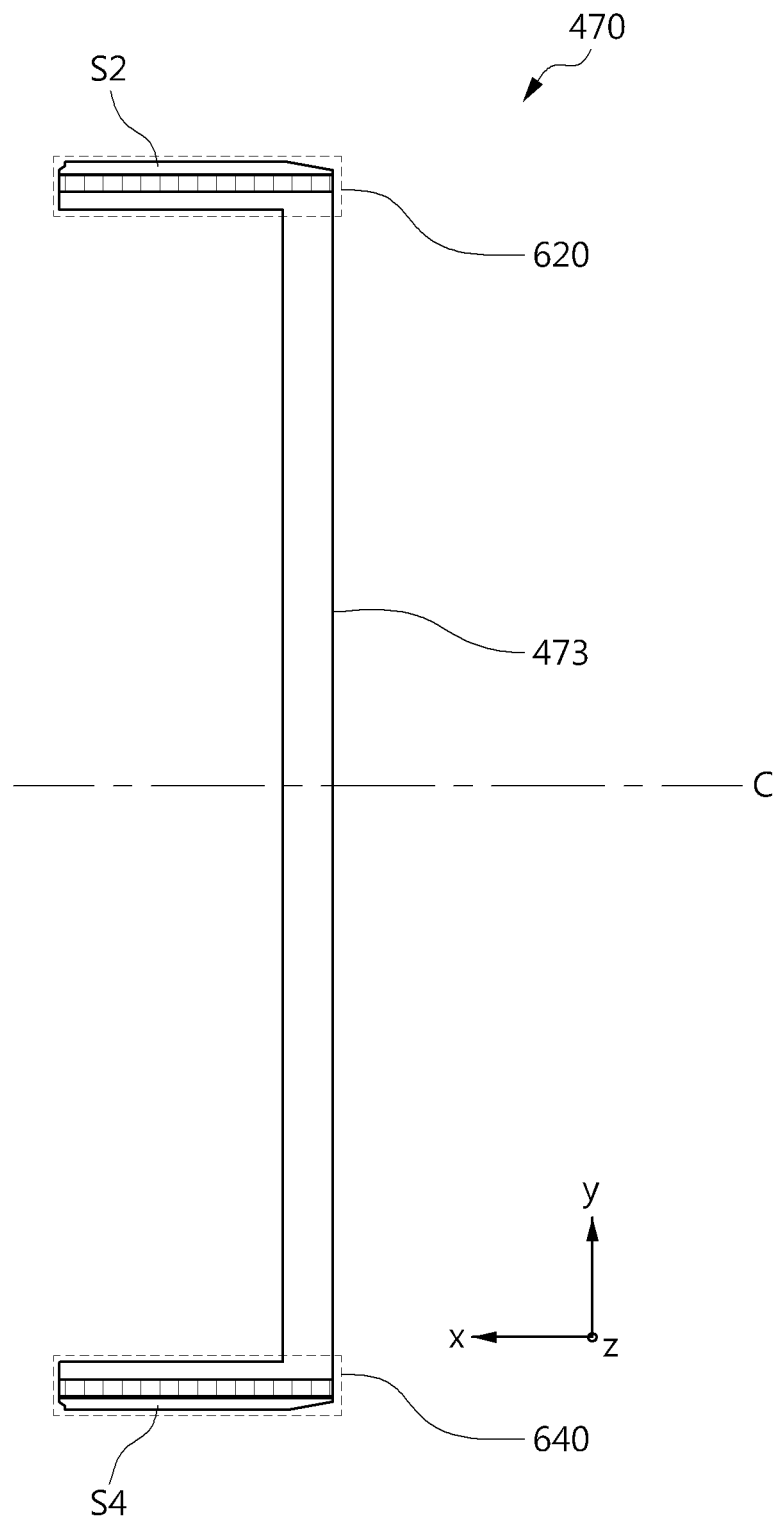
FIG. 7 is a plan view of a linear gear structure of FIG. 4 according to an embodiment of the disclosure.

FIG. 7 is a plan view of a linear gear structure 470 of FIG. 4 according to an embodiment of the disclosure.

Referring to FIGS. 4 and 7, in an embodiment of the disclosure, the linear gear structure 470 may include a second linear gear 620 and a fourth linear gear 640. The second linear gear 620 and the fourth linear gear 640 may be gear structures in which gear teeth are linearly arranged, for example, in the first direction (e.g., the +x axis direction), in which the sliding plate 220 can slide out, in the flat area of the linear gear structure 470. The second linear gear 620 and the fourth linear gear 640 may be symmetrical to each other with respect to the center line C of the electronic device 200. The linear gear structure 470 may include a support part 473 connecting the second linear gear 620 and the fourth linear gear 640 positioned to be spaced apart from each other. The linear gear structure 470 may have a shape symmetrical with respect to the center line C of the electronic device 200. According to an embodiment of the disclosure, the second linear gear 620, the fourth linear gear 640, and the support part 473 may be integrally formed, and may include the same material.

According to an embodiment of the disclosure, the linear gear structure 470 may include a second slide S2 disposed on a side facing the first support member 410 of FIG. 4. The linear gear structure 470 may include a fourth slide S4 disposed on a side facing the second support member 420 of FIG. 4. The second slide S2 and the fourth slide S4 may be symmetrical to each other with respect to the center line C of the electronic device 200. The second slide S2 may be positioned on (or inserted into) the first guide rail disposed on the first support member 410, and the fourth slide S4 may be positioned on (inserted into) the second guide rail disposed on the second support member 420. When the state of the electronic device 200 changes, the second slide S2 is guided and moved by the first guide rail, and the fourth slide S4 may be guided and moved by the second guide rail, whereby the linear gear structure 470 may perform a linear motion.

Figure 8:
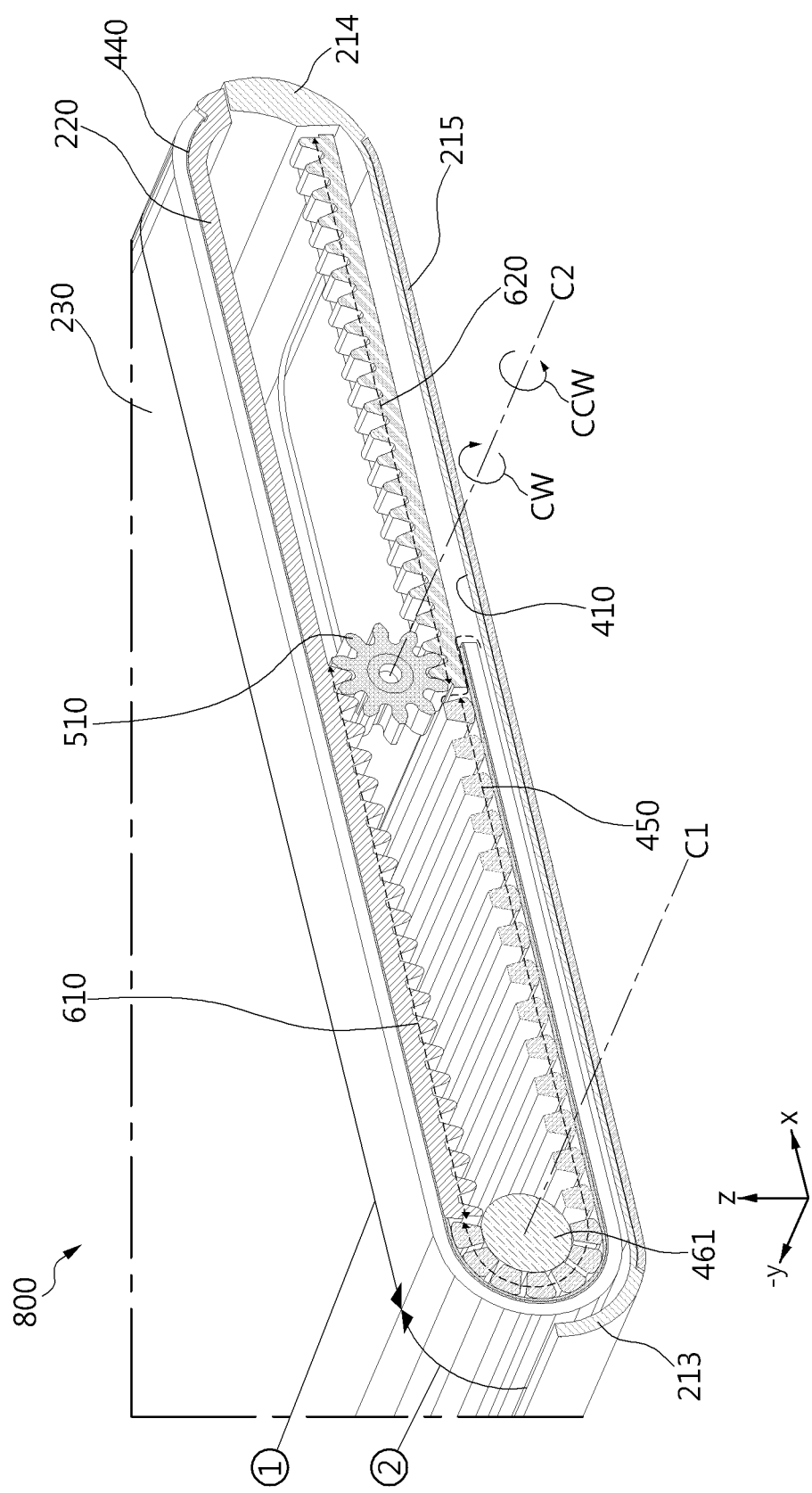
FIG. 8 is a view illustrating a cross-sectional structure taken along line A-A' in FIG. 2B according to an embodiment of the disclosure.

FIG. 8 is a view illustrating a cross-sectional structure 800 taken along line A-A' in FIG. 2B according to an embodiment of the disclosure.

Referring to FIG. 8, in an embodiment of the disclosure, the cross-sectional structure 800 may include a sliding plate 220, a flexible display 230, a support sheet 440, a first circular gear 510, and a first linear gear 610, a second linear gear 620, a multi-bar structure 450, a third side housing part 213, a fourth side housing part 214, or a back cover 215. Redundant descriptions of some of the reference numerals of FIG. 8 will be omitted.

According to an embodiment of the disclosure, the first circular gear 510 may be positioned between the first linear gear 610 and the second linear gear 620, and may be in the state of being engaged with the first linear gear 610 and the second linear gear 620.

For example, when the electronic device 200 is switched from the closed state (see FIG. 2A or 8) to the open state (see FIG. 3A), the sliding plate 220 may perform a linear motion in the +x axis direction, and the first linear gear 610 positioned on the sliding plate 220 may also perform a linear motion in the +x axis direction. When the first linear gear 610 performs a linear motion in the +x axis direction, the first circular gear 510 drivingly connected to the first linear gear 610 may be rotated in the clockwise direction (CW).

When the first circular gear 510 is rotated in the clockwise direction (CW), the second linear gear 620 drivingly connected (or engaged) with the first circular gear 510 may be moved in the −x axis direction. The driving connection state between elements may refer to the state in which motion or force acting thereon can be transmitted between the elements.

For example, when the electronic device 200 is switched from the open state (see FIG. 3A) to the closed state (see FIG. 2A or 8), the sliding plate 220 may perform a linear motion in the −x axis direction, and the first linear gear 610 positioned on the sliding plate 220 may also perform a linear motion in the −x axis direction. When the first linear gear 610 performs a linear motion in the −x axis direction, the second circular gear 510 drivingly connected (or engaged) with the first linear gear 610 may be rotated in the counterclockwise (CCW). When the first circular gear 510 is rotated in the counterclockwise direction (CCW), the second linear gear 620 drivingly connected (or engaged) with the first circular gear 510 may be moved in the +x axis direction.

Referring to FIG. 4, in an embodiment of the disclosure, the second circular gear 520 may be positioned between the third linear gear 630 and the fourth linear gear 640, and may be in the state of being engaged with the third linear gear 630 and the fourth linear gear 640. According to the state change of the electronic device 200, the third linear gear 630 may perform a linear motion in the same manner as the first linear gear 610. According to the state change of the electronic device 200, the fourth linear gear 640 may perform a linear motion in the same manner as the second linear gear 620. According to the state change of the electronic device 200, the second linear gear 520 may perform a rotational motion in the same manner as the first circular gear 510. A linear gear (e.g., the first linear gear 610, the second linear gear 620, the third linear gear 630, or the fourth linear gear 640) may be referred to as a rack or a rack gear. The circular gear (e.g., the first circular gear 510 or the second circular gear 520) may be referred to as a pinion or a pinion gear.

According to an embodiment of the disclosure, the first rotation center line C1 for the cylindrical roller 461 and the second rotation center line C2 for the first circular gear 510 may be parallel to each other. The first circular gear 510 may be positioned to be spaced apart from the cylindrical roller 461 in the first direction in which the sliding plate 220 can slide out (e.g., in the +x axis direction). The second area ② of the flexible display 230, a partial area of the support sheet 440 corresponding to the second area ②, and the multi-bar structure 450 corresponding to the second area ② may be drivingly connected to the cylindrical roller 461. The second area ② of the flexible display 230 and a partial area of the support sheet 440 corresponding to the second area ② may be in the state of being drivingly connected to the cylindrical roller 461 by being supported on the multi-bar structure 450, although not directly facing and coming into contact with the cylindrical roller 461. During the state change of the electronic device 200 (e.g., switching between the closed state and the open state, switching between the closed state and the intermediate state, or switching between the closed state and the open state), the second area ② of the flexible display 230, a partial area of the support sheet 440, and the multi-bar structure 450 move while rotating the cylindrical roller 461, and the movement and movement direction thereof may be guided by the rotation of the cylindrical roller 461. When the state of the electronic device 200 changes, the cylindrical roller 461 may rotate in the same direction as the first circular gear 510 and the second circular gear 520 (see FIG. 4).

According to an embodiment of the disclosure, the multi-bar structure 450 may be coupled to the support sheet 440, and an adhesive material may be interposed between the multi-bar structure 450 and the support sheet 440.

Figure 9A:
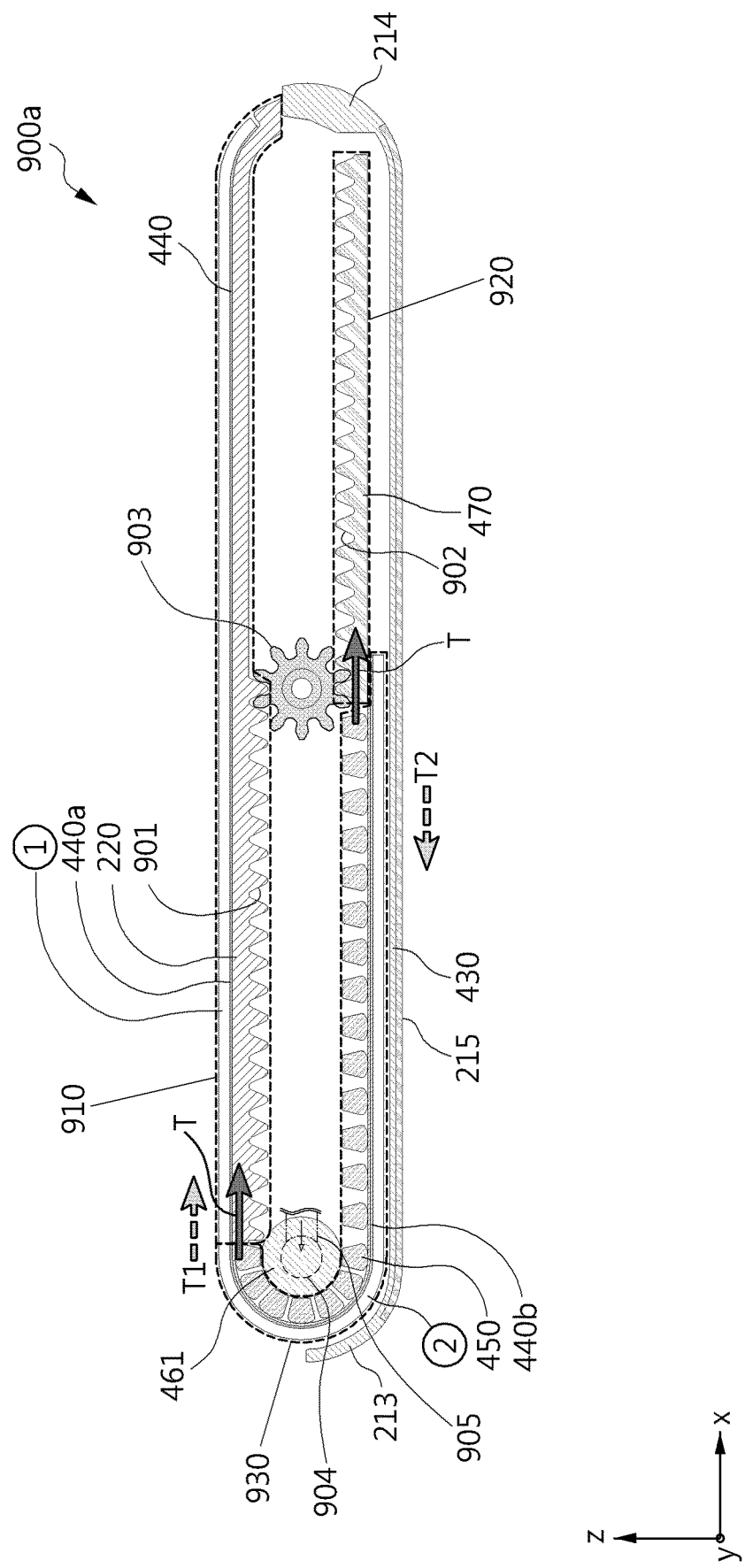
FIG. 9A is a view illustrating a cross-sectional structure of an electronic device in a closed state according to an embodiment of the disclosure.
Figure 9B:
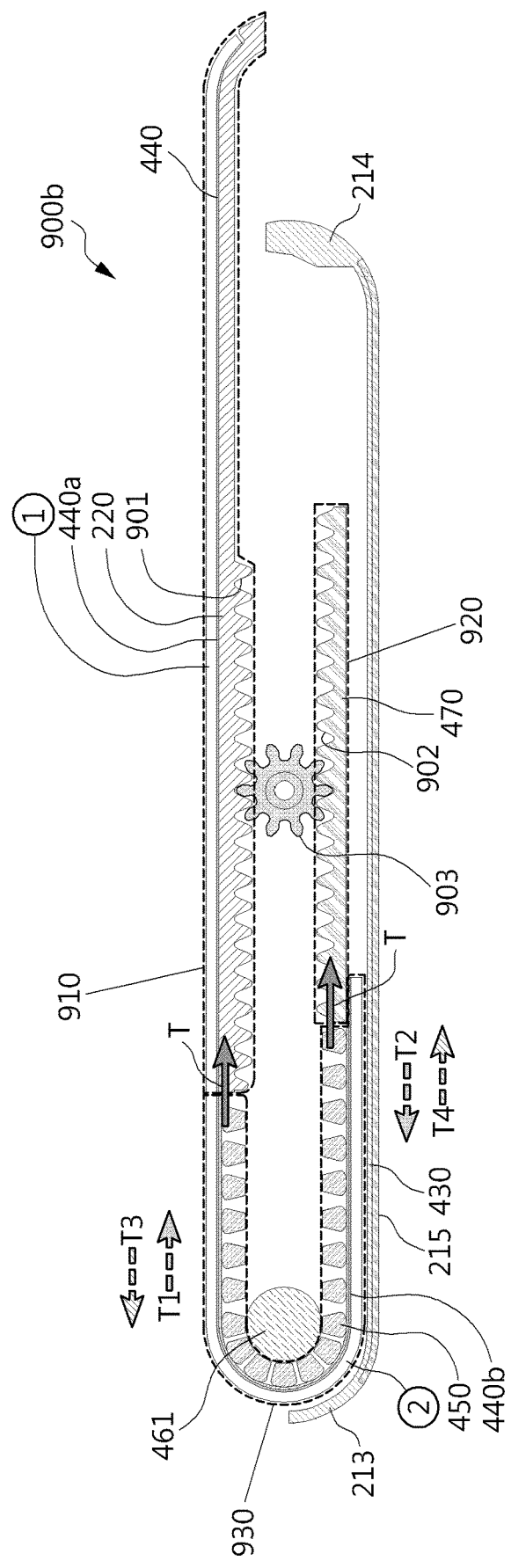
FIG. 9B is a view illustrating a cross-sectional structure of an electronic device in an intermediate state according to an embodiment of the disclosure.
Figure 9C:
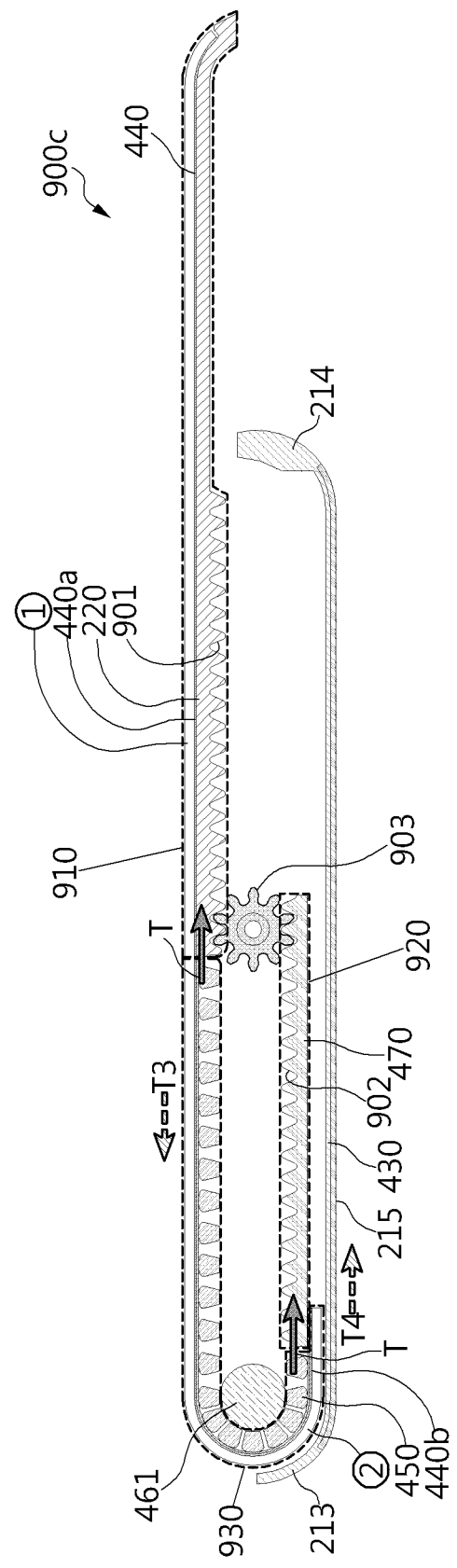
FIG. 9C is a view illustrating a cross-sectional structure of an electronic device in an open state according to an embodiment of the disclosure.

FIG. 9A is a view illustrating a cross-sectional structure 900*a* of an electronic device 200 in a closed state according to an embodiment of the disclosure. FIG. 9B is a view illustrating a cross-sectional structure 900*b* of the electronic device 200 in an intermediate state according to an embodiment of the disclosure. FIG. 9C is a view illustrating a cross-sectional structure 900*c* of the electronic device 200 in an open state according to an embodiment of the disclosure. The cross-sectional structure 900*a* illustrated in FIG. 9A may be, for example, a cross-sectional structure taken along line A-A' or line B-B' in FIG. 2B.

Referring to FIGS. 9A, 9B, and 9C, in an embodiment of the disclosure, the electronic device 200 may include a first operation section 910, a second operation section 920, a third operation section 930, a first linear gear 901, a second linear gear 902, a circular gear 903, the cylindrical roller 461, a third side housing part 213, a fourth side housing part 214, a back cover 215, or a third support member 430. When the cross-sectional structure 900*a* illustrated in FIG. 9A corresponds to the cross section taken along line A-A' in FIG. 2B, the first linear gear 901 may correspond to the first linear gear 610 of FIG. 4, the second linear gear 902 may correspond to the second linear gear 620 of FIG. 4, and the circular gear 903 may correspond to the first circular gear 510 of FIG. 4. When the cross-sectional structure 900*a* illustrated in FIG. 9A corresponds to the cross section taken along line B-B' in FIG. 2B, the first linear gear 901 may correspond to the third linear gear 630 of FIG. 4, the second linear gear 902 may correspond to the fourth linear gear 640 of FIG. 4, and the circular gear 903 may correspond to the second circular gear 520 of FIG. 4.

According to an embodiment of the disclosure, the first operation section 910 may include the first area ① of the flexible display 230, an area (hereinafter, referred to as a "third area") 440*a* of the support sheet 440 corresponding to the first area ①, and a sliding plate 220 including the first linear gear 901. The second operation section 920 may include a linear gear structure 470 including the second linear gear 902. The third operation section 930 may include a second area ② of the flexible display 230, an area (hereinafter, referred to as a "fourth area") 440*b* of the support sheet 440 corresponding to the second area ②, and a multi-bar structure 450. The flexible display 230 and the support sheet 440 may extend to the first operation section 910 and the third operation section 930 to connect the first operation section 910 and the third operation section 930 to each other. The sliding plate 220 of the first operation section 910 and the multi-bar structure 450 of the third operation section 930 may be connected to each other. The linear gear structure 470 of the second operation section 920 may be connected to the multi-bar structure 450 of the third operation section 930. According to various embodiments of the disclosure, the linear gear structure 470 of the second operation section 920 may be connected to the support sheet 440 of the third operation section 930.

According to some embodiments of the disclosure, the sliding plate 220 and the multi-bar structure 450 may be separated from each other. In this case, when the state of the electronic device 200 changes, a motion or force may be transmitted between the first operation section 910 and the second operation section 920 by the flexible display 230 and the support sheet 440.

According to various embodiments of the disclosure, FIG. 9A, 9B, or 9C illustrates an example in which the support sheet 440 is disposed in the entire first area ① of the flexible display 230, but the support sheet 440 is not limited thereto. The support sheet 440 may extend to a portion of the first area ①. Although the support sheet 440 extends as a portion of the first area ①, the support sheet 440 may connect the first operation section 910 and the third operation section 930 to each other. Even if the support sheet 440 extends as a portion of the first area ①, the support sheet 440 may transmit a motion or force between the first operation section 910 and the third operation section 930 when the state of the electronic device 200 changes, and may reduce the occurrence of stress between the first area ① and the second area ② of the flexible display 230.

According to some embodiments of the disclosure, when the multi-bar structure 450 is also capable of serving as the support sheet 440, the support sheet 440 may be omitted, and the multi-bar structure 450 may be connected to the sliding plate 220.

According to an embodiment of the disclosure, the circular gear 903 may be positioned between the first operation section 910 and the second operation section 920, and may be in the state of being engaged with the first linear gear 901 of the first operation section 910 and the second linear gear 902 of the second operation section 920 (e.g., a driving connection state). When the state change of the electronic device 200 changes, the circular gear 903 is capable of performing a rotational motion, and due to the first linear gear 901 and the second linear gear 902 engaged with the circular gear 903, the first operation section 910 and the second operation section 920 may linearly move in different directions. The cylindrical roller 461 may positioned to be spaced apart from the circular gear 930 to correspond to the third operation section 930 connecting the first operation section 910 and the second operation section 920 to each other, and may be rotatable about a rotation shaft parallel to the circular gear 903. The third operation section 930 connecting the first operation section 910 and the second operation section 920 is in a driving connection state with the cylindrical roller 461, and may move while rotating the cylindrical roller 461 when the first operation section 910 and the second operation section 920 linearly move.

For example, when a force that causes the first operation section 910 to linearly move in order to change the state of the electronic device 200 acts on the first operation section 910, the linear motion of the second operation section 920, the movement of the third operation section 920, the rotational motion of the circular gear 903, and the rotational motion of the cylindrical roller 461 may occur due to the driving connection state of the elements. The force that causes the first operation section 910 to linearly move may be provided by a user, or may be provided by a driving device positioned inside the electronic device 200. For example, when a signal is generated via an input device included in the electronic device 200, the first operation section 910 may be moved due to a driving device, such as a motor.

As another example, when a force that causes the second operation section 920 to linearly move in order to change the state of the electronic device 200 acts on the second operation section 920, the linear motion of the first operation section 910, the movement of the third operation section 920, the rotational motion of the circular gear 903, and the rotational motion of the cylindrical roller 461 may occur due to the driving connection state of the elements. A force that causes the second operation section 920 to linearly move in order to change the state of the electronic device 200 may be provided by a driving device positioned inside the electronic device 200. For example, when a signal is generated via an input device included in the electronic device 200, the second operation section 920 may be moved due to a driving device, such as a motor.

As another example, when a force that causes the circular gear 903 to rotate in order to change the state of the electronic device 200 acts on the circular gear 903, the linear motion of the first operation section 910, the linear motion of the second operation section 920, the movement of the third operation section 920, and a rotational motion of the cylindrical roller 461 may occur due to the driving connection of the elements. A force that causes the circular gear 903 to rotationally move in order to change the state of the electronic device 200 may be provided by a driving device positioned inside the electronic device 200. For example, when a signal is generated via an input device included in the electronic device 200, the circular gear 903 may be rotated due to a driving device, such as a motor. In this case, unlike the embodiment of FIG. 5, the first circular gear assembly 501 and the second circular gear assembly 502 may be implemented in a different form that is drivingly connected to the driving device.

According to various embodiments of the disclosure, when at least one driving device drivingly connected to the first operation section 910, the second operation section 920, or the circular gear 903 is implemented, the electronic device 200 may include a motor and a motor-driving circuit (e.g., a motor controller or a motor driver) electrically connected to the motor. The motor-driving circuit may control the motor based on a control signal received from a processor (e.g., the processor 120 of FIG. 1), and the rotating direction, rotating angle, rotating amount, rotating speed, rotating acceleration, or rotating angular speed of the motor may be adjusted. By controlling the motor, the moving position and/or moving speed of the flexible display 230 may be adjusted. According to an embodiment of the disclosure, the motor-driving circuit may include a motor encoder for detecting the driving state of the motor. The motor encoder may include, for example, a detector configured to be capable of detecting the rotating direction, rotating angle, rotating amount, rotating speed, rotating acceleration, or rotating angular speed of the rotation shaft using a disk coupled to the rotation shaft of the motor, and electronically recognizable scales and marks made on the disk.

According to various embodiments of the disclosure, a force that causes the first operation section or the second operation section 920 to linearly move in order to change the state of the electronic device 200 may be provided by an elastic structure positioned inside the electronic device 200. When the first operation section 910 is moved by an external force to a set distance, the electronic device 200 may be switched from the closed state to the open state or from the open state to a closed state by the elastic structure without any further external force (e.g., a semi-automatic slide operation). The elastic structure may include various elastic members, such as, a torsion spring. The torsion spring may include one end connected to the sliding plate 220, the other end connected to the housing 210 (see FIG. 2A), and a spring part between the one end and the other end. When the sliding plate 220 is moved by an external force to a distance set in the first direction (e.g., the +x axis direction) in which the sliding plate 220 slides out, the position of the one end relative to the other end is changed. Thus, the sliding plate 220 can be moved in the first direction due to the elastic force of the spring part without further external force, and thus the electronic device 200 can be switched from the closed state to the open state. When the sliding plate 220 is moved by an external force to a distance set in the second direction (e.g., the −x axis direction) opposite to the first direction, the position of the one end relative to the other end is changed. Thus, the sliding plate 220 can be moved in the second direction due to the elastic force of the spring part without further external force, and thus the electronic device 200 can be switched from the open state to the closed state.

Referring to FIG. 9A, in an embodiment of the disclosure, in the state in which the electronic device 200 is closed, when viewed from above the first area ① of the flexible display 230, the first linear gear 901 may overlap a portion of the multi-bar structure 450, and the multi-bar structure 450 may not overlap the second linear gear 902. Referring to FIG. 9C, in the state in which the electronic device 200 is opened, when viewed from above the first area ① of the flexible display 230, a portion of the multi-bar structure 450 may overlap the second linear gear 902, and the first linear gear 901 may not overlap the multi-bar structure 450. Referring to FIGS. 9A, 9B, and 9C, in the intermediate state of the electronic device 200, when viewed from above the first area ① of the flexible display 230, the first linear gear 901 and the second linear gear 902 may more overlap each other compared to the closed state or the open state of the electronic device 200.

According to an embodiment of the disclosure, the engaged state between the first linear gear 901 and the circular gear 903 and the engaged state between the second linear gear 902 and the circular gear 903 may cause a tension T to be maintained at the opposite sides of the third operation section 930 with respect to the cylindrical roller 461. The tension T may enable the second area ② of the flexible display 230 to be smoothly connected to the first area ① without being lifted.

According to an embodiment of the disclosure, when the tension T is in a critical range, the second area ② of the flexible display 230 may be maintained in a shape that is smoothly connected to the first area ① without being lifted when the electronic device 200 is in the closed state, the intermediate state, or the open state. When the tension T is in the critical range, the second area ② of the flexible display 230 may be maintained in a shape that is smoothly connected to the first area ① without being lifted when the state of the electronic device 200 changes. When the tension T is in the critical range, the slide operation may be smoothly performed when the state of the electronic device 200 changes.

For example, when the tension T is less than the critical range, the second area ② may be lifted or may not be smoothly connected to the first area ① due to the elasticity of the third operation section 930 (e.g., the elasticity of the flexible display 230 and/or the elasticity of the support sheet 470). When the tension T is less than the critical range, the frictional force between the third operation unit 930 and the cylindrical roller 461 may be reduced, and thus it may be difficult to smoothly perform the slide operation.

As another example, when the tension T is greater than the critical range, the second area ② may be smoothly connected to the first area ① without being lifted, but the slide operation may not be smoothly performed when the state of the electronic device 200 changes. When the tension T is greater than the critical range, the load on the rotation shaft of the cylindrical roller 461 and/or the rotation shaft of the circular gear 903 may exceed a critical value and may increase the resistance to the rotation, which may make it difficult to smoothly and gently perform the slide operation.

According to an embodiment of the disclosure, the multi-bar structure 450 may have elasticity that is sufficient to secure frictional force with the cylindrical roller 461 so as to reduce loss in motion transmission when a motion is transmitted between the multi-bar structure 450 and the cylindrical roller 461. The multi-bar structure 450 may have, for example, an elastic modulus in a direction from the third surface 451 to the fourth surface 452 in FIG. 4, and due to this elastic modulus, the multi-bar structure 450 may extend to the space between the cylindrical roller 461 and the second area ② so as to be in elastic contact with the cylindrical roller 461. The multi-bar structure 450 may extend to the space between the cylindrical roller 461 and the second area ② so as to be in elastic contact with the cylindrical roller 461, and thus the tension T may be in the critical range.

When the electronic device 200 is switched from the closed state to the intermediate state or the open state, or from the intermediate state to the open state, the first operation section 910 may be moved in the first direction (e.g., the +x axis direction). In this case, with respect to the cylindrical roller 461, a tension-side tension T1 may be generated at one side of the third operation section 930, and a relaxation-side tension T2 may be generated at the other side of the third operation section 930.

When the electronic device 200 is switched from the open state to the intermediate state or the closed state, or from the intermediate state to the closed state, the first operation section 910 may be moved in the second direction (e.g., the −x axis direction). In this case, with respect to the cylindrical roller 461, a relaxation-side tension T3 may be generated at one side of the third operation section 930, and a tension-side tension T4 may be generated at the other side of the third operation section 930.

According to an embodiment of the disclosure, a sliding assembly (or a sliding device) including the first operation section 910, the second operation section 920, the third operation section 930, the circular gear 903, and the cylindrical roller 461 may be implemented to minimize the difference between the relaxation-side tension and the tension-side tension. When the difference between the relaxation-side tension and the tension-side tension is minimized, a tension T included in the critical range may act substantially on opposite sides of the third operation section 930 with respect to the cylindrical roller 461 when the state of the electronic device 200 changes. The sliding assembly may be implemented so as to minimize loss in motion or force transmission when a motion or force is transmitted between the elements, and thus, the difference between the relaxation-side tension and the tension-side tension may be minimized. When loss in motion or force transmission is minimized, the first operation section 910 and the second operation section 920 may perform translational motions in different directions when the state of the electronic device 200 changes, and the moving distances thereof may be substantially the same. When the loss in motion or force transmission is minimized, the moving distance of the third operation section 930 may be substantially the same as the moving distance of the first operation section 910 and the second operation section 920 when the state of the electronic device 200 changes.

According to an embodiment of the disclosure, in order to reduce loss in motion transmission or force transmission, a lubricant (e.g., grease) may be interposed in a sliding assembly (or a sliding device) including the first operation section 910, the second operation section 920, the third operation section 930, the circular gear 903, and the cylindrical roller 461. For example, a lubricant is interposed in the friction portions between two elements that moves while rubbing against each other, such as the first linear gear 901 and the circular gear 903, and the second linear gear 902 and the circular gear 903 so as to assure smooth movement and durability. According to some embodiments of the disclosure, two elements that move while rubbing against each other may be coated with a lubricant so as to reduce friction.

In an embodiment of the disclosure, referring to FIGS. 4, 9A, 9B, and 9C, with respect to the sliding assembly (or the sliding device) including the first operation section 910, the second operation section 920, the third operation section 930, the circular gear 903, and the cylindrical roller 461, in order to reduce loss in motion transmission or loss in force transmission, a lubricant (e.g., grease) may be interposed between the first rotation shaft of the pulley 460 and the first support member 410, and between the second rotation shaft 463 of the pulley 460 and the second support member 420. According to some embodiments of the disclosure, the friction portions between the first rotation shaft and the first support member 410, and the friction portions between the second rotation shaft 463 and the second support member 420 may be coated with a lubricant. According to various embodiments of the disclosure, by using bearings, the first rotation shaft may be connected to the first shaft 411 of the first support member 410, and the second rotation shaft may be connected to the second shaft 421 of the second support member 420.

In an embodiment of the disclosure, referring to FIGS. 4, 9A, 9B, and 9C, with respect to the sliding assembly (or the sliding device) including the first operation section 910, the second operation section 920, the third operation section 930, the circular gear 903, and the cylindrical roller 461, in order to reduce loss in motion transmission or loss in force transmission, a lubricant (e.g., grease) may be interposed between the first circular gear 510 and the first shaft 411. According to some embodiments of the disclosure, the frictional portions between the first circular gear 510 and the first shaft 411 may be coated with a lubricant. According to various embodiments of the disclosure, a bearing may be positioned between the first circular gear 510 and the first shaft 411.

According to an embodiment of the disclosure, the sliding plate 220 including the first linear gear 901, the linear gear structure 470 including the second linear gear 902, the circular gear 900, and the cylindrical roller 461 may be formed of a material (e.g., metal or engineering plastic) having rigidity or endurance that is not substantially deformed in response to a force acting when the state of the electronic device 200 changes. According to an embodiment of the disclosure, the third operation section 930 may be implemented so as to practically prevent the third operation section 930 from being stretched in response to a tension when the state of the electronic device 200 changes. For example, the support sheet 440 and/or the multi-bar structure 450 positioned on the rear surface of the flexible display 230 may serve to prevent the third operation section 930 from being stretched in response to the tension T. The multi-bar structure 450 may be coupled to the support sheet 440, and an adhesive material may be interposed between the support sheet 440 and the multi-bar structure 450. When the support sheet 440 and the multi-bar structure 450 are coupled of each other, endurance that prevents the third operation section 930 from being stretched in response to the tension T when the state of the electronic device 200 changes can be improved.

According to an embodiment of the disclosure, the fourth area 440b of the support sheet 440 corresponding to the second area ② of the flexible display 230 has a lattice structure for contributing to the flexibility of the third operation section 930 (e.g., the lattice structure including the plurality of openings 441 in FIG. 4). The lattice structure may be implemented in a form capable of reducing the elongation of the fourth area 440b, which is caused in response to tension, as much as possible while supporting smooth bending of the third operation section 930 when the state of the electronic device 200 changes. According to some embodiments of the disclosure, an additional reinforcement member (e.g., a reinforcement sheet) may be coupled to the lattice structure so as to prevent the fourth area 440b including the lattice structure from being stretched in response to tension when the state of the electronic device 200 changes. For example, at least one reinforcement sheet may be attached to the lattice structure of the support sheet 440 in a form extending in the direction of tension T so as to prevent the lattice structure from being stretched such that the tension T does not decrease when the tension T acts on the support sheet 440. For this reason, the second area ② of the flexible display 230 can be maintained in a shape disposed smoothly with the first area ① without being lifted.

According to an embodiment of the disclosure, there may be a backlash (e.g., a gap or tolerance between teeth when gears are engaged with each other) for smooth operation of the first linear gear 901 and the circular gear 903. There may be a backlash for smooth operation of the second linear gear 902 and the circular gear 903. The backlash is capable of preventing inter-gear lubrication and gear breakage. According to an embodiment of the disclosure, even if there are a backlash between the first linear gear 901 and the circular gear 903 and a backlash between the second linear gear 902 and the circular gear 903, the state in which the first linear gear 901 and the second linear gear 902 are engaged with the circular gear 903 interposed therebetween, and the driving connection state of the first linear gear 901, the second linear gear 902, and the cylindrical roller 461 may reduce the phenomenon in which a motion or force transmission is not responded immediately due to a backlash. Accordingly, when the state of the electronic device 200, changes, the tension T included in the critical range can be maintained substantially equally on the opposite sides of the third operation section 930, and the second area ② of the flexible display 230 may be moved while maintaining a shape of being smoothly connected with the first area ① without being lifted.

According to some embodiments of the disclosure, the cylindrical roller 461 (or the pulley 460 in FIG. 4) may be replaced with a curved member including a curved portion, which comes into contact with the multi-bar structure 450. In order to reduce the frictional force between the curved portion of the curved member and the multi-bar structure 450, the surface of the curved portion or the surface of the multi-bar structure 450 may be coated with a lubricant, or a lubricant may be interposed between the curved portion and the multi-bar structure 450. According to some embodiments of the disclosure, the cylindrical roller 461 (or the pulley 460 in FIG. 4) may be defined as a curved member that is rotatably implemented based on friction with the multi-bar structure 450.

In various embodiments of the disclosure, referring to FIG. 9A, the electronic device 200 may further include an elastic structure 905, which elastically supports a rotation shaft 904 of the cylindrical roller 461 (e.g., the first rotation shaft and the second rotation shaft 463 of the pulley 460 in FIG. 4) in a direction (e.g., the −x direction) opposite to the direction in which the first operation section 910 slides out. The elastic structure 905 may provide a force to separate the rotation shaft 904 of the cylindrical roller 461 in a direction away from the rotation shaft of the circular gear 903. The elastic structure 905 may serve to allow the second area ② of the flexible display 230 to be smoothly connected to the first area ① without being lifted. The elastic structure 905 may serve to allow the second area ② of the electronic device 200 to move while maintaining the shape of being smoothly connected to the first area © without being lifted. The elastic structure 905 may serve to make the tension T included in the critical range act on opposite sides of the third operation section 930.

Figure 9D:
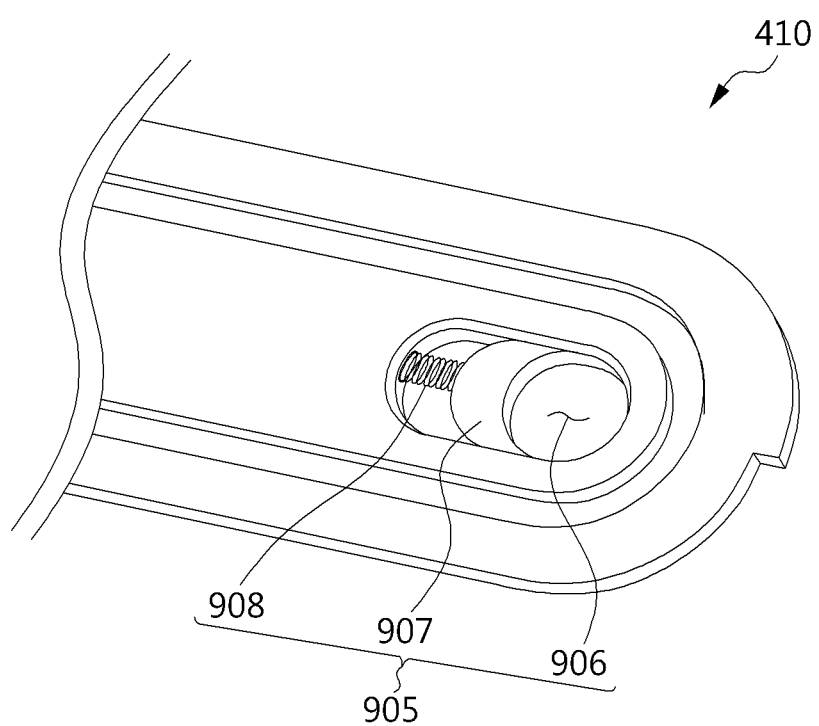
FIG. 9D is a view illustrating a first support member in which an elastic structure of FIG. 9A is positioned according to an embodiment of the disclosure.

FIG. 9D illustrates a first support member 410 in which an elastic structure 905 of FIG. 9A is positioned according to an embodiment of the disclosure.

Referring to FIG. 9D, for example, the first through hole 412 in the first support member 410 illustrated in FIG. 4 may be replaced with the elastic structure 905 of FIG. 9D. According to an embodiment of the disclosure, the elastic structure 905 may include a slide 907 positioned in a first through hole 906 (or a first recess) formed in the first support member 410 and an elastic member 908 (e.g., a compression spring), which elastically supports the slide 907. The first rotation shaft of the pulley 460 illustrated in FIG. 4 may be connected to the first through hole 906. The slide 907 elastically supported by the elastic member 908 may provide a force to separate the first rotation shaft of the pulley 460 in a direction away from the rotation shaft of the first circular gear 510 of FIG. 4. Although not illustrated, the same elastic structure may also be provided on the second support member 410 of FIG. 4 for the second rotation shaft 463 of the pulley 460 (see FIG. 4).

Figure 10:
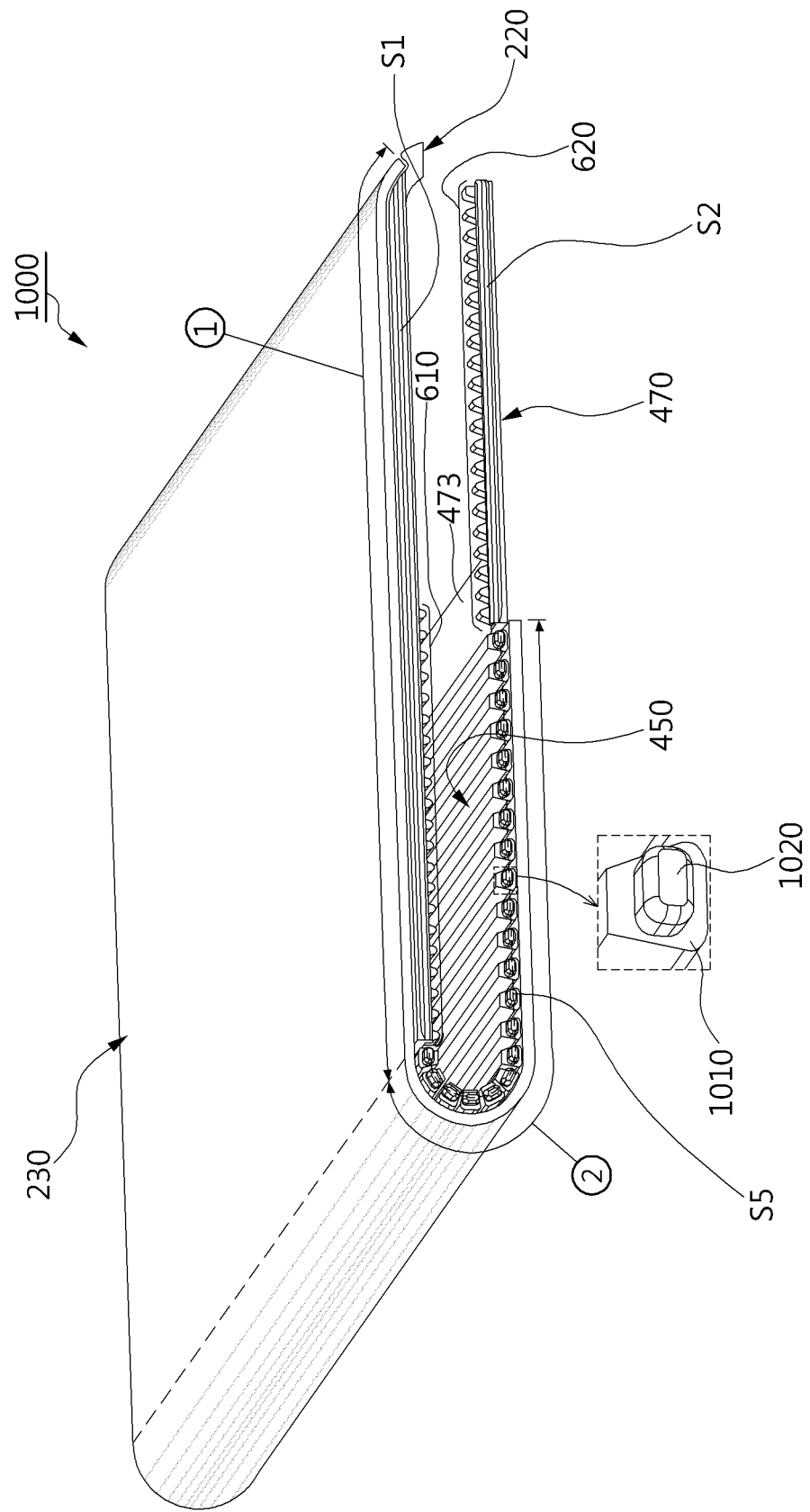
FIG. 10 is a view illustrating an assembly including a sliding plate, a flexible display, a multi-bar structure, and a linear gear structure according to an embodiment of the disclosure.
Figure 11:
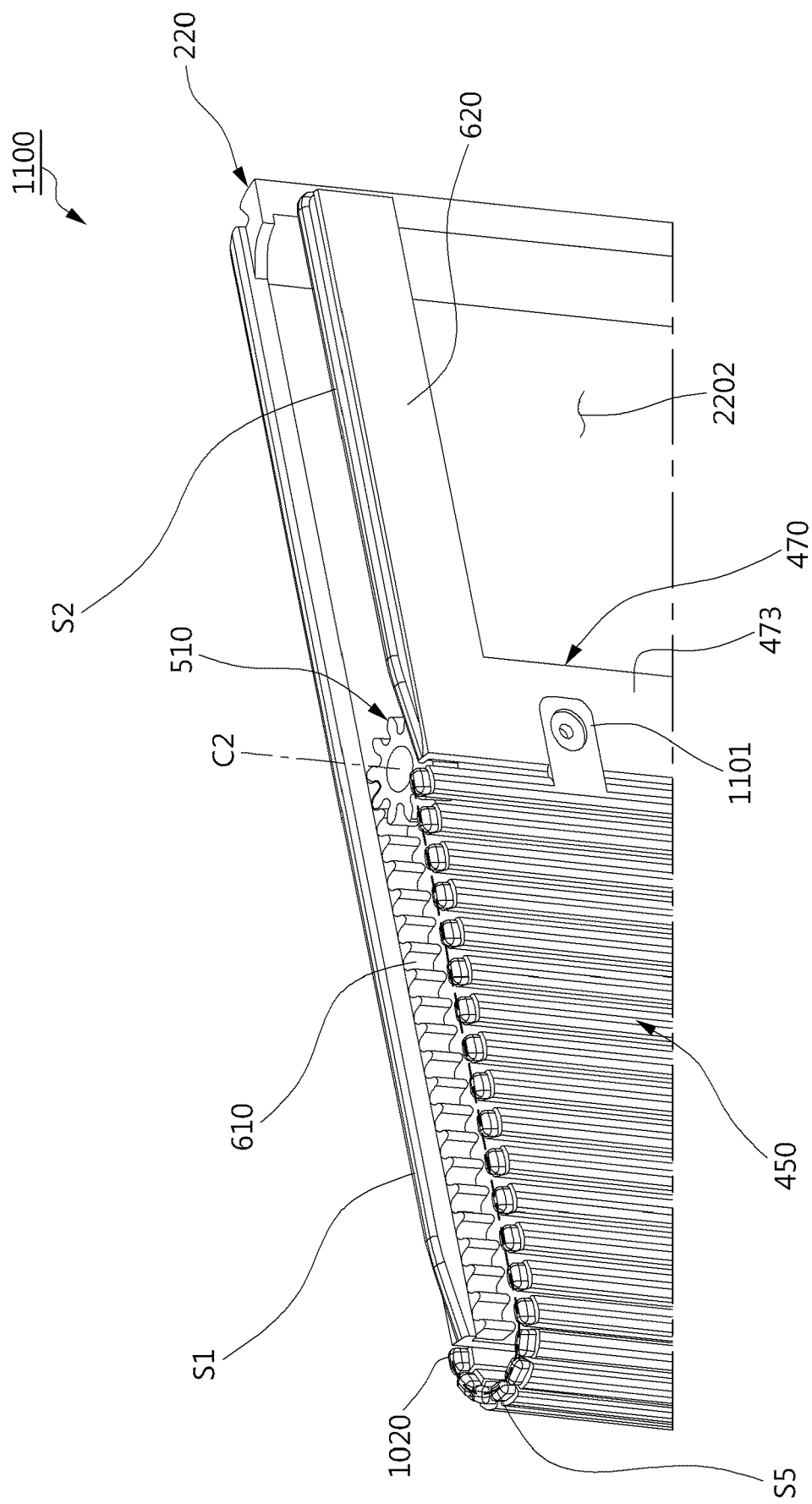
FIG. 11 is a view illustrating an assembly including a sliding plate, a multi-bar structure, a linear gear structure, and a first circular gear according to an embodiment of the disclosure.

FIG. 10 illustrates an assembly 1000 including a sliding plate 220, a flexible display 230, a multi-bar structure 450, and a linear gear structure 470 according to an embodiment of the disclosure. FIG. 11 illustrates an assembly 1100 including a sliding plate 220, a multi-bar structure 450, a linear gear structure 470, and a first circular gear 510 according to an embodiment of the disclosure. Redundant descriptions of some of the reference numerals of FIG. 9A, 9B, 9C, 9D, or 10 will be omitted.

Referring to FIGS. 10 and 11, in an embodiment of the disclosure, the first area ① of the flexible display 230 may be disposed to overlap the sliding plate 220. The multi-bar structure 450 may extend along the second area ② of the flexible display 230 so as to support the second area ②. A support sheet 440 (see FIG. 4, 9A, 9B, or 9C) may be disposed on the rear surface of the flexible display 230, and the multi-bar structure 450 may face the support sheet 440. The multi-bar structure 450 may take a form in which a plurality of bars 1010 are arranged to extend in the direction of the second rotation center line C2 of the first circular gear 510. In FIG. 11, the part connecting the plurality of bars included in the multi-bar structure 450 is omitted, but the part connecting the plurality of bars may be positioned to face the support sheet 440 (see FIG. 4, 9A, 9B, or 9C). According to some embodiments of the disclosure, the plurality of bars included in the multi-bar structure 450 may be attached to the support sheet 440 disposed on the rear surface of the flexible display 230 using an adhesive material. According to some embodiments of the disclosure, the support sheet 440 and the multi-bars may be implemented as an integral structure.

According to an embodiment of the disclosure, the multi-bar structure 450 and the linear gear structure 470 may be connected to each other. For example, the multi-bar structure 450 may include a connection part 1101, which partially overlaps the support part 473 of the linear gear structure 470, and the connection part 1101 may be coupled to the support part 473 of the linear gear structure 470 using a bolt or an adhesive material. A plurality of connection parts 1101 may be arranged in the direction of the second rotation center line C2.

According to an embodiment of the disclosure, the sliding plate 220 may include a first slide S1 and a second slide S3 (see FIG. 6). The linear gear structure 470 may include a second slide S2 and a fourth slide S4 (see FIG. 7).

According to an embodiment of the disclosure, the multi-bar structure 450 may include a fifth slide S5 disposed on a side facing the first support member 410 of FIG. 4. The fifth slide S5 may refer to a structure in which a plurality of slides 1020, which are formed on respective bars 1010, are arranged in a multi-bar structure 450. Although not illustrated, the multi-bar structure 450 may include a sixth slide S5 disposed on a side facing the second support member 420 of FIG. 4. The fifth slide S5 and the sixth slide may be symmetrical to each other with respect to the center line C of the electronic device 200 (see FIG. 2A, 2B, 3A, or 3B).

Figure 12:
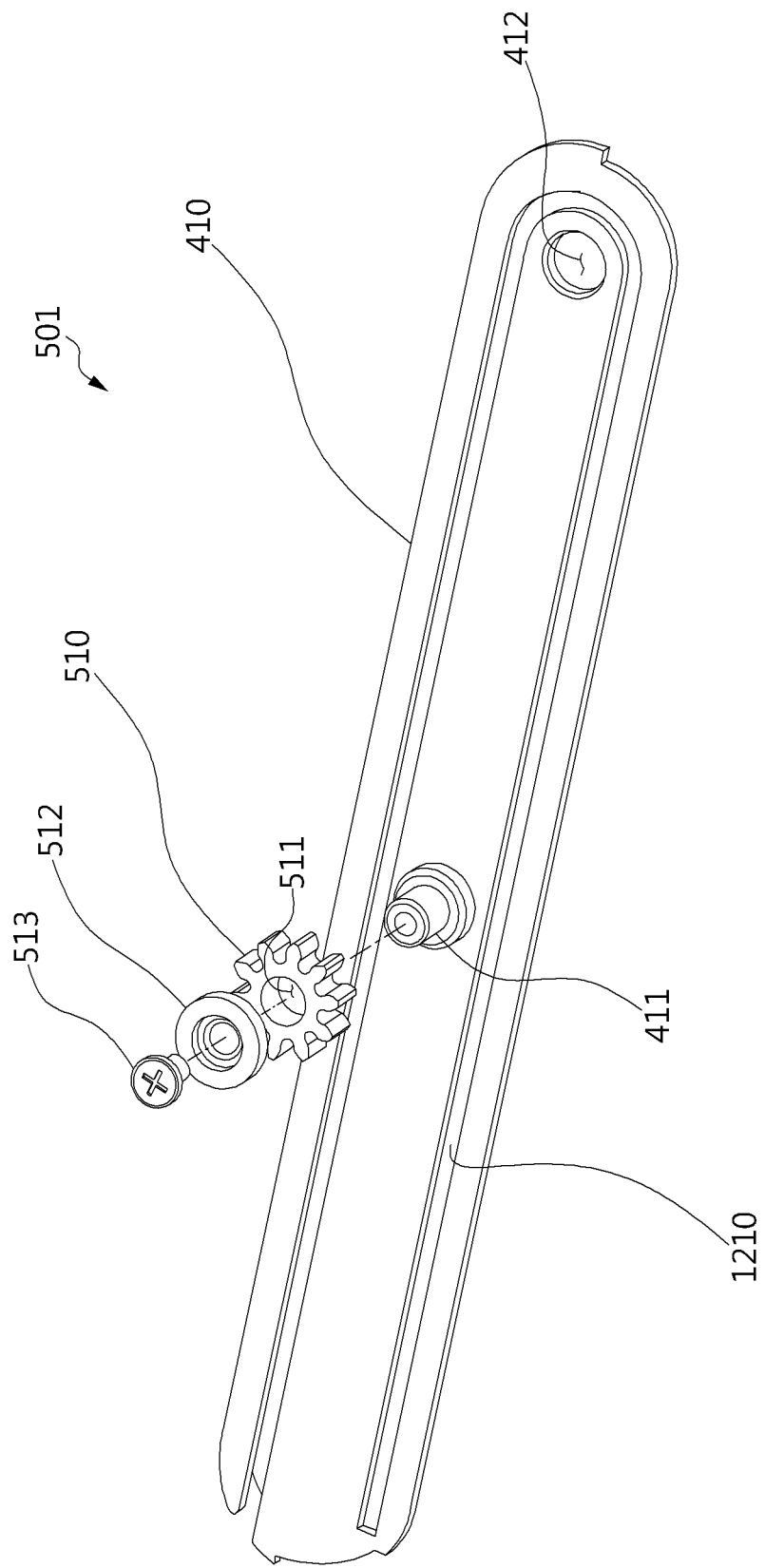
FIG. 12 is an exploded perspective view of a first circular gear assembly according to an embodiment of the disclosure.
Figure 13:
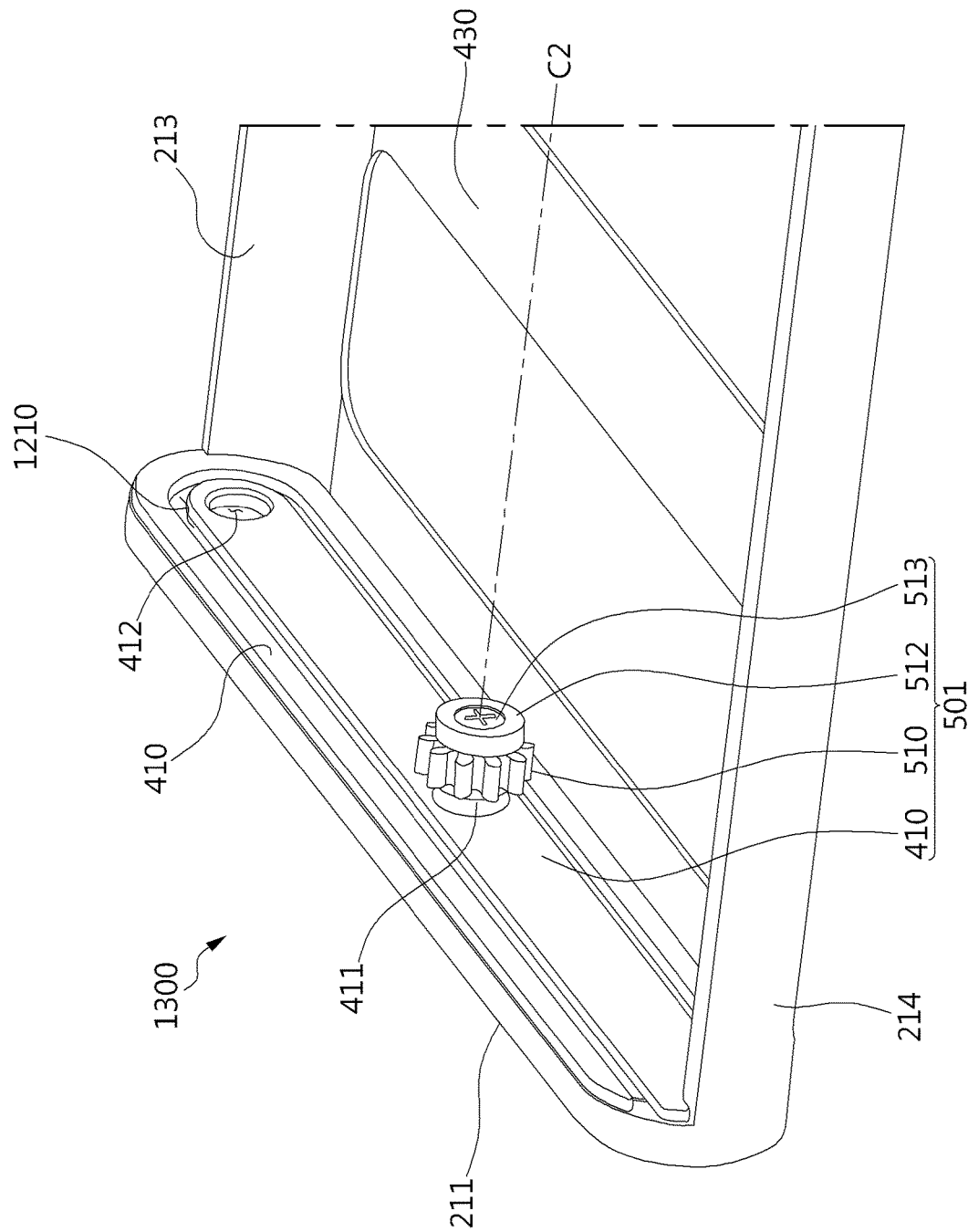
FIG. 13 is a perspective view of an assembly including a first circular gear assembly and a housing according to an embodiment of the disclosure.
Figure 14:
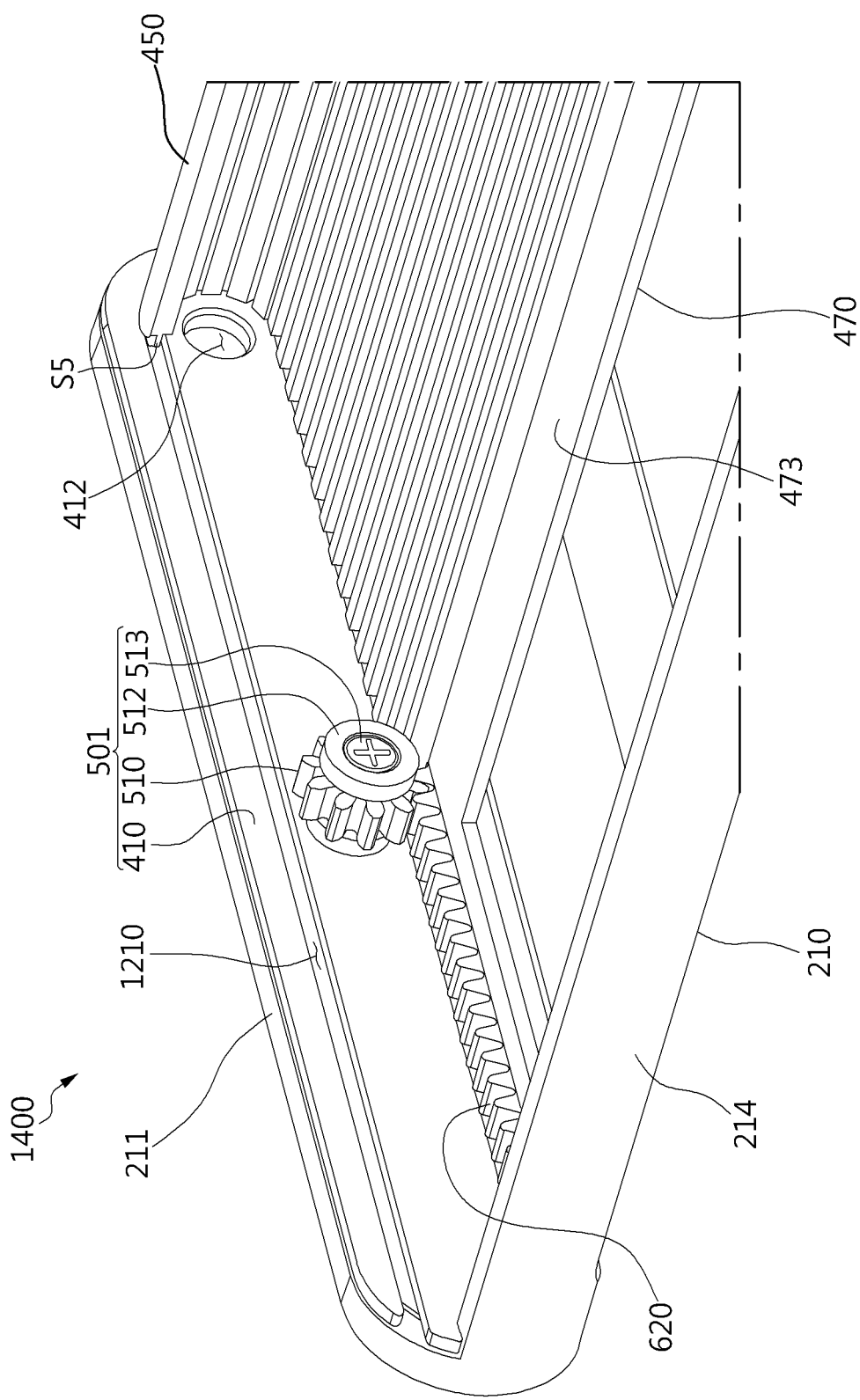
FIG. 14 is a perspective view of an assembly including a first circular gear assembly, a housing, a multi-bar structure, and a linear gear structure according to an embodiment of the disclosure.
Figure 15:
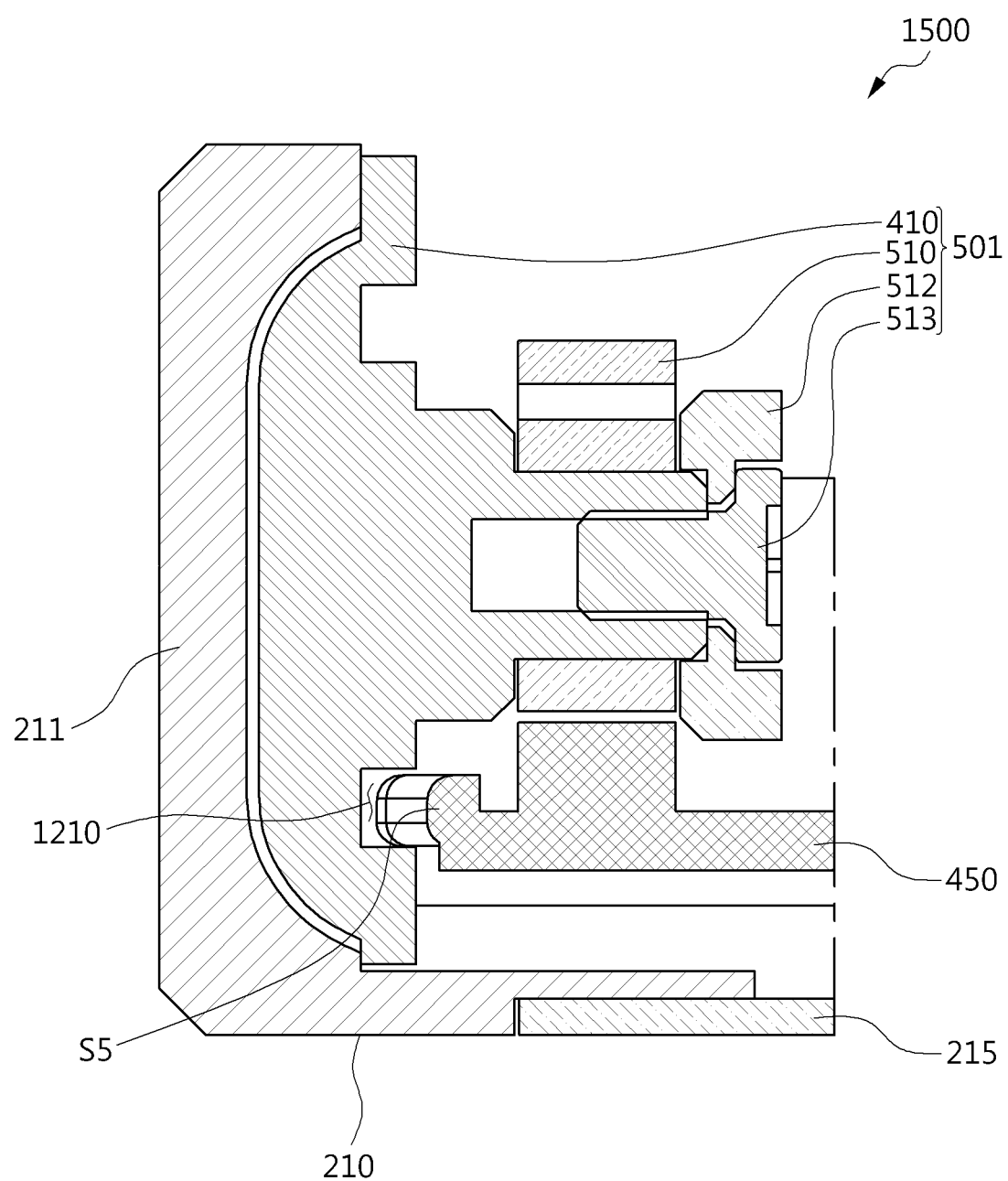
FIG. 15 is a view illustrating a cross-sectional structure of an assembly including a first circular gear assembly, a housing, and a multi-bar structure according to an embodiment of the disclosure.

FIG. 12 is an exploded perspective view of a first circular gear assembly 501 (see FIG. 5) according to an embodiment of the disclosure. FIG. 13 is a perspective view of an assembly 1300 including a first circular gear assembly 501 and a housing 210 according to an embodiment of the disclosure. FIG. 14 is a perspective view of an assembly 1400 including a first circular gear assembly 501, a housing 210, a multi-bar structure 450, and a linear gear structure 470 according to an embodiment of the disclosure. FIG. 15 is a view illustrating a cross-sectional structure 1500 of an assembly including a first circular gear assembly 501, a housing 210, and a multi-bar structure 450 according to an embodiment of the disclosure.

Referring to FIG. 12, in an embodiment of the disclosure, the first circular gear assembly 501 may include a first support member 410, a first circular gear 510, a first separation prevention member 512, and a first bolt 513. The first support member 410 may include a first shaft 411 connected to the first circular gear 510 and a first through hole 412 connected to the first rotational shaft of the pulley 460 illustrated in FIG. 4. Referring to FIGS. 13 and 14, in an embodiment of the disclosure, the first circular gear assembly 501 may be disposed in the first side housing part 211 of the housing 210. The second circular gear assembly 502 positioned to be symmetrical to the first circular gear assembly 501 may be disposed on the second side housing part 212 of the housing 210 (see FIG. 5). Redundant descriptions of some of the reference numerals in FIGS. 12, 13, 14, and 15 will be omitted.

According to an embodiment of the disclosure, the first support member 410 may include a first guide rail 1210.

Referring to FIGS. 10, 11, 12, 13, 14, and 15, the first slide S1 of the sliding plate 220, the second slide S2 of the linear gear structure 470, and the fifth slide 55 of the multi-bar structure 450 may be positioned on (or inserted into) the first guide rail 1210. The first guide rail 1210 may include a groove formed in one surface of the first support member 410 to which the first circular gear 510 is coupled. The second support member 420 of FIG. 4 or 5 may include a second guide rail. The second guide rail may include a groove formed in one surface of the second support member 420 to which the second circular gear 520 is coupled. The third slide S3 of the sliding plate 220 (see FIG. 6), the fourth slide S4 of the linear gear structure 470 (see FIG. 7), and the sixth slide of the multi-bar structure 450 may be positioned on (inserted into) the second guide rail. The movement and movement direction of the assembly 1000 including the sliding plate 220, the flexible display 230, the multi-bar structure 450, and the linear gear structure 470 (see FIG. 10) may be guided by the first guide rail 1210 and the second guide rail. According to an embodiment of the disclosure, a lubricant (e.g., grease) may be disposed on the first guide rail 1210 and the second guide rail in order to assure smooth motion and to reduce loss in motion transmission or loss in force transmission. According to some embodiments of the disclosure, the first guide rail 1210 and the second guide rail may be coated with a lubricant. According to some embodiments of the disclosure, the first slide S1, the second slide S2, the third slide S3, the fourth slide S4, the fifth slide S5, and the sixth slide S6 may be coated with a lubricant.

According to an embodiment of the disclosure, an electronic device (e.g., the electronic device 200 in FIG. 4) may include a housing (e.g., the housing 210 in FIG. 4). The electronic device may include a plate (e.g., the sliding plate 220 in FIG. 4) that can slide out from the housing. The electronic device may include a flexible display (e.g., the flexible display 230 in FIG. 4). The flexible display may include a first area (e.g., the first area ① in FIG. 4) disposed on one surface of the plate, and a second area (e.g., the second area ② in FIG. 4), which extends from the first area and is at least partially drawn out from the inner space of the housing when the flexible display is slid out. The electronic device may include a curved member (e.g., the pulley 460 in FIG. 4) positioned in the inner space of the housing to correspond to the second area. The electronic device may include a first linear gear (e.g., the first linear gear 610 in FIG. 4). The first linear gear may be positioned on the other surface of the plate, and may include a plurality of gear teeth arranged in the first direction in which the plate is slid out. The electronic device may include a second linear gear (e.g., the second linear gear 620 in FIG. 4). The second linear gear may include a plurality of gear teeth arranged in the first direction. The electronic device may include a circular gear (e.g., the first circular gear 510 in FIG. 4). The circular gear may be rotatable with respect to a rotation shaft perpendicular to the first direction (e.g., the second rotation center line C2 or the third rotation center line C3 in FIG. 4), and may be positioned between the first linear gear and the second linear gear to be spaced apart from the curved member in a second direction opposite to the first direction. The circular gear may be engaged with the first linear gear and the second linear gear.

According to an embodiment of the disclosure, the electronic device (e.g., the electronic device 200 of FIG. 4) may further include a display support structure (e.g., the multi-bar structure 450 of FIG. 4) extending to the space between the second area (e.g., the second area ② in FIG. 4) and the curved member (e.g., the pulley 460 in FIG. 4). The display support structure may be connected to the second linear gear (e.g., the second linear gear 620 in FIG. 4).

According to an embodiment of the disclosure, the display support structure may include a multi-bar structure (e.g., the multi-bar structure 450 in FIG. 4).

According to an embodiment of the disclosure, the curved member may include a pulley (e.g., the pulley 460 in FIG. 4) that is rotatable about another rotation shaft parallel to the rotation shaft of the circular gear (e.g., the first circular gear 510 in FIG. 4).

According to an embodiment of the disclosure, the electronic device (e.g., the electronic device 200 in FIG. 4) may further include an elastic structure (e.g., the elastic structure 905 in FIG. 9A) that elastically supports the pulley (e.g., the pulley 460) in the second direction.

According to an embodiment of the disclosure, the housing (e.g., the housing 210 in FIG. 4) may include a first side housing part (e.g., the first side housing part 211 in FIG. 4) and a second side housing part (e.g., the second side housing part 212 in FIG. 4), which are positioned opposite to each other in a direction perpendicular to the first direction. The circular gear (e.g., the first circular gear 510 in FIG. 4) may be rotatably coupled to a support member (e.g., the first support member 410 or the second support member 420 in FIG. 4) disposed or included in the first side housing part or the second side housing part.

According to an embodiment of the disclosure, the electronic device (e.g., the electronic device 200 in FIG. 4) may further include a display support structure (e.g., the multi-bar structure 450 in FIG. 4) extending to a space between the second area and the curved member, and coupled to overlap the second area. The support member (e.g., the first support member 410 in FIG. 4) may include a guide rail (e.g., the first guide rail 1210 in FIG. 12), into which a slide (e.g., the first slide S1 in FIG. 10) disposed on one side of the plate (e.g., the sliding plate 220 in FIG. 10), a slide (e.g., the second slide S2 in FIG. 10) disposed on one side of the second linear gear (e.g., the second linear gear S2 in FIG. 10), and a slide (e.g., the fifth slide S5 in FIG. 10) disposed on one side of the display support structure are inserted.

According to an embodiment of the disclosure, the curved member may include a pulley (e.g., the pulley 460 in FIG. 4) that is rotatable about a rotation shaft parallel to the rotation shaft of the circular gear (e.g., the first circular gear 510 in FIG. 4). The rotation shaft of the pulley may be rotatably connected to the support member (e.g., the first support member 410 or the second support member 420 in FIG. 4).

According to an embodiment of the disclosure, the circular gear (e.g., the first circular gear 510 in FIG. 4) may be connected to a shaft (e.g., the first shaft 411 in FIG. 4) extending from the support member (e.g., the first support member 410 in FIG. 4).

According to an embodiment of the disclosure, the electronic device (e.g., the electronic device 200 in FIG. 4) may further include a metal support sheet (e.g., the support sheet 440 in FIG. 4) positioned on the rear surface of the flexible display (e.g., the flexible display 230 in FIG. 4).

According to an embodiment of the disclosure, the metal support sheet (e.g., the support sheet 440 in FIG. 4) may include a lattice structure having a plurality of openings (e.g., the plurality of openings 441 in FIG. 4) formed to correspond to the second area (e.g., the second area ② in FIG. 4).

According to an embodiment of the disclosure, the metal support sheet (e.g., the support sheet 440 of FIG. 4) may be connected to the second linear gear (e.g., the second linear gear 620 of FIG. 4).

According to an embodiment of the disclosure, the electronic device (e.g., the electronic device 200 in FIG. 2A) may further include a multi-bar structure (e.g., the multi-bar structure 450 in FIG. 9A) extending to the space between the second area (e.g., the second area ② in FIG. 4) and the curved member (e.g., the pulley 460 in FIG. 4) and coupled to overlap the second area, and the multi-bar structure may be connected to the second linear gear (e.g., the second linear gear 902 in FIG. 9A). In the state in which the plate (e.g., the sliding plate 220 in FIG. 9A) is not slid out, when viewed from above the first area (e.g., the first area ① in FIG. 9A), the first linear gear (e.g., the first linear gear 901 in FIG. 9A) may overlap a portion of the multi-bar structure, and the multi-bar structure may not overlap the second linear gear.

According to an embodiment of the disclosure, the electronic device (e.g., the electronic device 200 in FIG. 2A) may further include a multi-bar structure (e.g., the multi-bar structure 450 in FIG. 9C) extending to the space between the second area (e.g., the second area ② in FIG. 4) and the curved member (e.g., the pulley 460 in FIG. 4) and coupled to overlap the second area, and the multi-bar structure may be connected to the second linear gear (e.g., the second linear gear 902 in FIG. 9C). In the state in which the plate (e.g., the sliding plate 220 of FIG. 9C) is slid out, when viewed from above the first area (e.g., the first area ① in FIG. 9C), a portion of the multi-bar structure may overlap the second linear gear, and the first linear gear (e.g., the first linear gear 901 in FIG. 9C) may not overlap the multi-bar structure.

According to an embodiment of the disclosure, the electronic device (e.g., the electronic device 200 in FIG. 4) may further include a display support structure (e.g., the multi-bar structure 450 in FIG. 4) extending to a space between the second area and the curved member, and coupled to overlap the second area. The housing (e.g., the housing 210 in FIG. 4) may include a first side housing part (e.g., the first side housing part 211 in FIG. 4) and a second side housing part (e.g., the first side housing part 211 in FIG. 4), which are positioned opposite to each other in a direction perpendicular to the first direction. The electronic device (e.g., the electronic device 200 in FIG. 4) may further include a third linear gear 630 (e.g., the third linear gear 630 in FIG. 4) positioned on the other surface of the plate (e.g., the sliding plate 220 in FIG. 4) to be symmetrical to the first linear gear (e.g., the first linear gear 610 in FIG. 4) with respect to the center line (e.g., the center line C in FIG. 2A) between the first side housing part and the second side housing part. The electronic device may further include a fourth linear gear (e.g., the fourth linear gear 640 in FIG. 4) connected to the display support structure to be symmetrical to the second linear gear (e.g., the second linear gear 620 in FIG. 4) with respect to the center line. The electronic device may further include another circular gear (e.g., the second circular gear 520 in FIG. 4) engaged with the third linear gear and the fourth linear gear to be symmetrical to the circular gear (e.g., the first circular gear 510 in FIG. 4) with respect to the center line.

According to various embodiments, an electronic device (e.g., the electronic device 200 in FIG. 4) may include a housing (e.g., the housing 210 in FIG. 4). The housing may include a first side housing part (e.g., the first side housing part 211 in FIG. 4) and a second side housing part (e.g., the second side housing part 212 in FIG. 4) positioned opposite to each other. The electronic device may include a plate (e.g., the sliding plate 220 in FIG. 4) that can be slid out from the housing (e.g., the housing 210 in FIG. 4) in a second direction perpendicular to the first direction oriented from the first side housing part 211 toward the second side housing part 212. The electronic device may include a flexible display (e.g., the flexible display 23 in FIG. 4). The flexible display may include a first area (e.g., the first area ① in FIG. 4) disposed on one surface of the plate, and a second area (e.g., the second area ② in FIG. 4), which extends from the first area and is at least partially drawn out from the inner space of the housing when the flexible display is slid out. The electronic device may include a curved member (e.g., the pulley 460 in FIG. 4) positioned in the inner space of the housing to correspond to the second area. The electronic device may include a multi-bar structure (e.g., the multi-bar structure 450 in FIG. 4). The multi-bar structure may extend to the space between the second area and the curved member, and may be coupled to overlap the second area. The electronic device may include a first linear gear (e.g., the first linear gear 610 in FIG. 4) and a third linear gear (e.g., the second linear gear 620 in FIG. 4), which are positioned on the other surface of the plate. The electronic device may include a linear gear structure (e.g., the linear gear structure 470 in FIG. 4). The linear gear structure may be connected to the multi-bar structure, and may include a second linear gear (e.g., the second linear gear 620 in FIG. 4) and a fourth linear gear (e.g., the fourth linear gear 640 in FIG. 4). The electronic device may include a first circular gear (e.g., the first circular gear 510 in FIG. 4). The first circular gear may be rotatably coupled to a first support member (e.g., the first support member 410 in FIG. 4), which is disposed or included in the first side housing part to be rotatable about the first rotation shaft (e.g., the second rotation center line C2 in FIG. 2A) in the first direction. The first circular gear may be engaged with the first linear gear and the second linear gear between the first linear gear and the second linear gear. The electronic device may include a second circular gear (e.g., the second circular gear 520 in FIG. 4). The second circular gear may be coupled to the second support member disposed or included in the second side housing part to be rotatable about a second rotation shaft (e.g., the third rotation center line C3 in FIG. 4), which is spaced apart from the first rotation shaft in the first direction and is parallel to the first rotation shaft. The second circular gear may be engaged with the third linear gear and the fourth linear gear between the third linear gear and the fourth linear gear. The first circular gear and the second circular gear may be spaced apart from the curved member in a third direction opposite to the second direction.

According to various embodiments of the disclosure, the curved member may include a pulley rotatable about a third rotation shaft (e.g., the first rotation center line C1 in FIG. 4) parallel to the first rotation shaft (e.g., the second rotation center line C2 in FIG. 4) and the second rotation shaft (e.g., the third rotation center line C3 in FIG. 4).

According to various embodiments of the disclosure, the first support member (e.g., the first support member 410 in FIG. 4) may include a first guide rail (e.g., the first guide rail 1210 in FIG. 12), into which a slide (e.g., the first slide S1 in FIG. 10) disposed on one side of the plate (e.g., the sliding plate 410 in FIG. 4), a slide (e.g., the second slide S2 in FIG. 10) disposed on one side of the second linear gear (e.g., the second linear gear S2 in FIG. 10), and a slide (e.g., the fifth slide S5 in FIG. 10) disposed on one side of the multi-bar structure (e.g., the multi-bar structure 450 in FIG. 10) are inserted. The second support member (e.g., the second support member 420 in FIG. 4) may include a second guide rail, into which another slide (e.g., the third slide S3 in FIG. 6) disposed on the other side of the plate, another slide (e.g., the fourth slide S4 in FIG. 4) disposed the other side of second linear gear, and a slide (e.g., the sixth slide) disposed on the other side of the multi-bar structure are inserted.

According to various embodiments of the disclosure, the electronic device (e.g., the electronic device 200 in FIG. 4) may further include a metal support sheet (e.g., the support sheet 440 in FIG. 4) positioned on the rear surface of the flexible display (e.g., the flexible display 230 in FIG. 4), and an adhesive material between the metal support sheet and the multi-bar structure (e.g., the multi-bar structure 450 in FIG. 4).

According to various embodiments of the disclosure, the metal support sheet (e.g., the support sheet 440 in FIG. 4) may include a lattice structure having a plurality of openings (e.g., the plurality of openings 441 in FIG. 4) formed to correspond to the second area (e.g., the second area ② in FIG. 4).

According to various embodiments of the disclosure, In the state in which the plate (e.g., the sliding plate 220 in FIG. 9A) is not slid out, when viewed from above the first area (e.g., the first area ① in FIG. 9A), the first linear gear (e.g., the first linear gear 901 in FIG. 9A) may overlap a portion of the multi-bar structure (e.g., the multi-bar structure 450 in FIG. 9A), and the multi-bar structure may not overlap the second linear gear (e.g., the second linear gear 902 in FIG. 9A). In the state in which the plate (e.g., the sliding plate 220 of FIG. 9C) is slid out, when viewed from above the first area (e.g., the first area ① in FIG. 9C), a portion of the multi-bar structure (e.g., the multi-bar structure 450 in FIG. 9C) may overlap the second linear gear (e.g., the second linear gear 902 in FIG. 9C), and the first linear gear (e.g., the first linear gear 901 in FIG. 9C) may not overlap the multi-bar structure.

According to an embodiment of the disclosure, the electronic device (e.g., the electronic device 200 in FIG. 4) may further include an elastic structure (e.g., the elastic structure 905 in FIG. 9A) that elastically supports the pulley (e.g., the pulley 460) in the third direction.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing;
a plate capable of being slid out from the housing;
a flexible display comprising a first area disposed on one surface of the plate, and a second area extending from the first area and at least partially drawn out from an inner space of the housing when the plate is slid out;
a curved member positioned in an inner space of the housing to correspond to the second area;
a first linear gear positioned on another surface of the plate, and comprising a plurality of gear teeth arranged in a first direction in which the plate is slid out;
a second linear gear comprising a plurality of gear teeth arranged in the first direction;
a multi-bar structure extending to a space between the second area and the curved member, coupled to overlap the second area, and connected to the second linear gear; and
a circular gear capable of being rotated about a rotation shaft perpendicular to the first direction, and disposed between the first linear gear and the second linear gear to be spaced apart from the curved member in a second direction opposite to the first direction, the circular gear being engaged with the first linear gear and the second linear gear, and
wherein, in a state in which the plate is slid out, when viewed from above the first area, a portion of the multi-bar structure overlaps the second linear gear, and the first linear gear does not overlap the multi-bar structure.

2. The electronic device of claim 1, wherein the curved member comprises a pulley capable of being rotated about the rotation shaft parallel to the rotation shaft of the circular gear.

3. The electronic device of claim 2, further comprising:
an elastic structure configured to elastically support the pulley in the second direction.

4. The electronic device of claim 1,
wherein the housing comprises a first side housing part and a second side housing part, which are positioned opposite to each other in a direction perpendicular to the first direction, and
wherein the circular gear is rotatably coupled to a support member disposed or included in the first side housing part or the second side housing part.

5. The electronic device of claim 4,
wherein the support member comprises:
a guide rail, into which a slide disposed on a side of the plate;
a slide disposed on a side of the second linear gear; and
a slide disposed on a side of the multi-bar structure are inserted.

6. The electronic device of claim 4,
wherein the curved member comprises a pulley capable of being rotated about the rotation shaft parallel to the rotation shaft of the circular gear, and
wherein the rotation shaft of the pulley is rotatably connected to the support member.

7. The electronic device of claim 4, wherein the circular gear is connected to a shaft extending from the support member.

8. The electronic device of claim 1, further comprising:
a metal support sheet positioned on a rear surface of the flexible display.

9. The electronic device of claim 8, wherein the metal support sheet comprises a lattice structure comprising a plurality of openings formed to correspond to the second area.

10. The electronic device of claim 8, wherein the metal support sheet is connected to the second linear gear.

11. The electronic device of claim 1,
wherein, in a state in which the plate is not slid out, when viewed from above the first area, the first linear gear overlaps a portion of the multi-bar structure, and the multi-bar structure does not overlap the second linear gear.

12. The electronic device of claim 1,
wherein the housing comprises:
a first side housing part, and
a second side housing part, which are positioned opposite to each other in a direction perpendicular to the first direction, and
wherein the electronic device further comprises:
a third linear gear positioned on the other surface of the plate to be symmetrical to the first linear gear with respect to a center line between the first side housing part and the second side housing part;
a fourth liner gear connected to the multi-bar structure to be symmetrical to the second linear gear with respect to the center line; and
another circular gear engaged with the third linear gear and the fourth linear gear to be symmetrical the circular gear with respect to the center line.

13. The electronic device of claim 12, wherein, in the state in which the plate is slid out, when view from above the first area, the portion of the multi-bar structure overlaps the fourth linear gear, and the third linear gear does not overlap the multi-bar structure.

14. An electronic device comprising:
a housing comprising a first side housing part and a second side housing part, which are positioned opposite to each;
a plate capable of being slid out from the housing in a second direction perpendicular to a first direction oriented from the first side housing part toward the second side housing part;
a flexible display comprising a first area disposed on one surface of the plate, and a second area extending from the first area and at least partially drawn out from an inner space of the housing when the plate is slid out;
a curved member positioned in an inner space of the housing to correspond to the second area;
a multi-bar support structure extending to a space between the second area and the curved member, and coupled to overlap the second area;
a first linear gear and a third linear gear positioned on another surface of the plate;
a linear gear structure connected to the multi-bar structure, and comprising a second linear gear and a fourth linear gear;
a first circular gear coupled to a first support member disposed or included in the first side housing part to be capable of being rotated about a first rotation shaft in the first direction, and engaged with the first linear gear and the second linear gear between the first linear gear and the second linear gear; and
a second circular gear spaced apart from the first rotation shaft in the first direction and coupled to a second support member disposed or included in the second side housing part to be capable of being rotated about a second rotation shaft parallel to the first rotation shaft, the second circular gear being engaged with the third linear gear and the fourth linear gear between the third linear gear and the fourth linear gear,
wherein the first circular gear and the second circular gear are spaced apart from the curved member in a third direction opposite to the second direction, and
wherein, in a state in which the plate is slid out, when viewed from above the first area, a portion of the multi-bar structure overlaps the second linear gear, and the first linear gear does not overlap the multi-bar structure.

15. The electronic device of claim 14, wherein, in the state in which the plate is slid out, when view from above the first area, the portion of the multi-bar structure overlaps the fourth linear gear, and the third linear gear does not overlap the multi-bar structure.

16. The electronic device of claim 14, wherein the curved member comprises a pulley capable of being rotated about a third rotation shaft parallel to the first rotation shaft and the second rotation shaft.

17. The electronic device of claim 14,
wherein the first support member comprises a first guide rail, into which a slide disposed on one side of the plate, a slide disposed on one side of the second linear gear, and a slide disposed on one side of the multi-bar structure are inserted, and
wherein the second support member comprises a second guide rail, into which another slide disposed on another side of the plate, another slide disposed on another side of the second linear gear, and another slide disposed on another side of the multi-bar structure are inserted.

18. The electronic device of claim 14, further comprising:
a metal support sheet positioned on a rear surface of the flexible display; and
an adhesive member between the metal support sheet and the multi-bar structure.

19. The electronic device of claim 18, wherein the metal support sheet comprises a lattice structure comprising a plurality of openings formed to correspond to the second area.

20. The electronic device of claim 14,
wherein, in a state in which the plate is not slid out, when viewed from above the first area, the first linear gear overlaps a portion of the multi-bar structure, and the multi-bar structure does not overlap the second linear gear.

21. The electronic device of claim 20,
wherein, in the state in which the plate is not slid out, when viewed from above the first area, the third linear gear overlaps the portion of the multi-bar structure, and the multi-bar structure does not overlap the fourth linear gear.

22. The electronic device of claim 16, further comprising:
an elastic structure configured to elastically support the pulley in the third direction.

* * * * *